(12) United States Patent
Takeda

(10) Patent No.: US 9,312,301 B2
(45) Date of Patent: Apr. 12, 2016

(54) IMAGING ELEMENT AND METHOD OF MANUFACTURING THE SAME

(71) Applicant: Sony Corporation, Tokyo (JP)

(72) Inventor: Takeshi Takeda, Kanagawa (JP)

(73) Assignee: Sony Corporation, Tokyo (JP)

( * ) Notice: Subject to any disclaimer, the term of this patent is extended or adjusted under 35 U.S.C. 154(b) by 105 days.

(21) Appl. No.: 14/070,261

(22) Filed: Nov. 1, 2013

(65) Prior Publication Data
US 2014/0131779 A1 May 15, 2014

(30) Foreign Application Priority Data

Nov. 9, 2012 (JP) .................................. 2012-247581

(51) Int. Cl.
H01L 27/146 (2006.01)

(52) U.S. Cl.
CPC ...... *H01L 27/14689* (2013.01); *H01L 27/1464* (2013.01); *H01L 27/14603* (2013.01); *H01L 27/14609* (2013.01); *H01L 27/14623* (2013.01)

(58) Field of Classification Search
CPC ............ H01L 27/146; H01L 27/14643; H01L 27/14689; H01L 27/14627; H01L 27/1464; H01L 27/14623; H01L 27/14609
USPC ............................................. 257/292; 438/69
See application file for complete search history.

(56) References Cited

U.S. PATENT DOCUMENTS

2006/0231898 A1* 10/2006 Jeong et al. .................. 257/359
2008/0290382 A1* 11/2008 Hirota .......................... 257/291

FOREIGN PATENT DOCUMENTS

JP 2003-31785 A 1/2003
JP 2008-103647 A 5/2008

* cited by examiner

*Primary Examiner* — Asok K Sarkar
*Assistant Examiner* — Dmitriy Yemelyanov
(74) *Attorney, Agent, or Firm* — Sheridan Ross P.C.

(57) ABSTRACT

A solid-state image sensor including a substrate having a photoelectric conversion element disposed therein, the photoelectric conversion element converting an amount of incident light into a charge amount, a memory unit disposed at a side of the photoelectric conversion element, the memory unit receiving the charge amount from the photoelectric conversion element, a first light-shielding section formed at a first side of the memory unit and disposed between the charge accumulation region and the photoelectric conversion element, and a second light-shielding section formed at a second side of the memory unit such that the second side is opposite the first side.

15 Claims, 20 Drawing Sheets

IMAGING ELEMENT AND METHOD OF MANUFACTURING THE SAME

BACKGROUND

The present technology relates to an imaging element and a method of manufacturing the same, and more particularly, to an imaging element that suppresses an influence of stray light and a method of manufacturing the same.

Since CMOS image sensors of the related art generally are rolling shutter type sensors that sequentially read pixels, an image may be distorted due to differences in exposure timing for each pixel. To prevent this problem, a global shutter type image sensor in which all of the pixels can simultaneously be read by forming charge retention units in pixels has been suggested (see Japanese Unexamined Patent Application Publication No. 2008-103647). In a global shutter type image sensor, after all of the pixels are simultaneously read to charge retention units, the pixels are sequentially read. Therefore, since an exposure timing may be common for each pixel, it is possible to prevent distortion from occurring in the image.

SUMMARY

In Japanese Unexamined Patent Application Publication No. 2008-103647, the global shutter type image sensor has been suggested. However, in the global shutter type image sensor, it is necessary to form a charge retention region inside a pixel. For this reason, the layout of the pixel may be restricted. As described in Japanese Unexamined Patent Application Publication No. 2008-103647, since the charge retention region is inside the layout of the pixel, an aperture ratio may decrease. Thus, there is a concern that the sensitivity of a photodiode may deteriorate or that the capacity of the photodiode and the charge retention region may be reduced.

Further, there is a concern that optical noise may be an issue since light enters the charge retention region during charge retention. To suppress the occurrences of optical noise, it is necessary to reduce the size of the charge retention region; however, with a smaller charge retention region, there is a probability that the saturation capacity of the charge retention region may deteriorate due to the smaller size of the charge retention region.

To prevent such reduction in the sensitivity, Japanese Unexamined Patent Application Publication No. 2003-31785 suggests a method of using a rear-surface illumination type sensor. By using the rear-surface illumination type sensor, a wiring layer inside a pixel can be formed on the rear side of the sensor, and thus vignetting of incident light by the wiring layer can be suppressed. However, when the charge retention region is formed inside a pixel of the rear-surface illumination type sensor, the charge retention region is formed on the front surface side of a substrate in a deep region of the substrate with respect to incident light. Thus, it may be difficult to prevent light from leaking to the charge retention region.

It is desirable to provide a technology capable of preventing light from leaking into a charge retention region and suppressing an occurrence of a virtual image caused by light entering the charge retention region.

In accordance with at least one embodiment of the present invention, a solid-state image sensor is provided, the solid-state image sensor comprising a substrate having a photoelectric conversion element disposed therein, the photoelectric conversion element converting an amount of incident light into a charge amount, a memory unit disposed at a side of the photoelectric conversion element, the memory unit receiving the charge amount from the photoelectric conversion element, a first light-shielding section formed at a first side of the memory unit and disposed between the charge accumulation region and the photoelectric conversion element, and a second light-shielding section formed at a second side of the memory unit such that the second side is opposite the first side.

In accordance with at least one embodiment of the present invention an electronic device is provided, the electronic apparatus including an optical unit, and a solid-state imaging device comprising unit pixels arranged in a 2-dimential matrix, wherein each unit pixel comprises a substrate having a photoelectric conversion element disposed therein, the photoelectric conversion element converting an amount of incident light into a charge, a memory unit disposed at a side of the photoelectric conversion element, the memory unit receiving the charge from the photoelectric conversion element, a first light-shielding section formed at a first side of the memory unit and disposed between the charge accumulation region and the photoelectric conversion element, and a second light-shielding section formed at a second side of the memory unit such that the second side is opposite the first side.

In accordance with at least one embodiment of the present invention, a method of manufacturing a solid-state image sensor is provided, the method comprising the steps of implanting a plurality of isolation regions into a substrate, implanting impurities into the plurality of isolation regions to form one or more photodiodes, one or more memory units, and one or more transfer gates, forming one or more trenches in portions of the substrate in which light-shielding sections are to be formed, embedding a light-shielding material into the one or more trenches, and wherein a first light-shielding section is formed at a first side of the memory unit and disposed between a charge accumulation region and the photodiode and wherein a second light-shielding section is formed at a second side of the memory unit such that the second side is opposite the first side.

According to the embodiments of the present technology, it is possible to prevent light from leaking into the charge retention region and suppress an occurrence of a virtual image.

DETAILED DESCRIPTION OF EMBODIMENTS

Hereinafter, modes (hereinafter, referred to as embodiments) for carrying out the present technology will be described.

Figure 1:
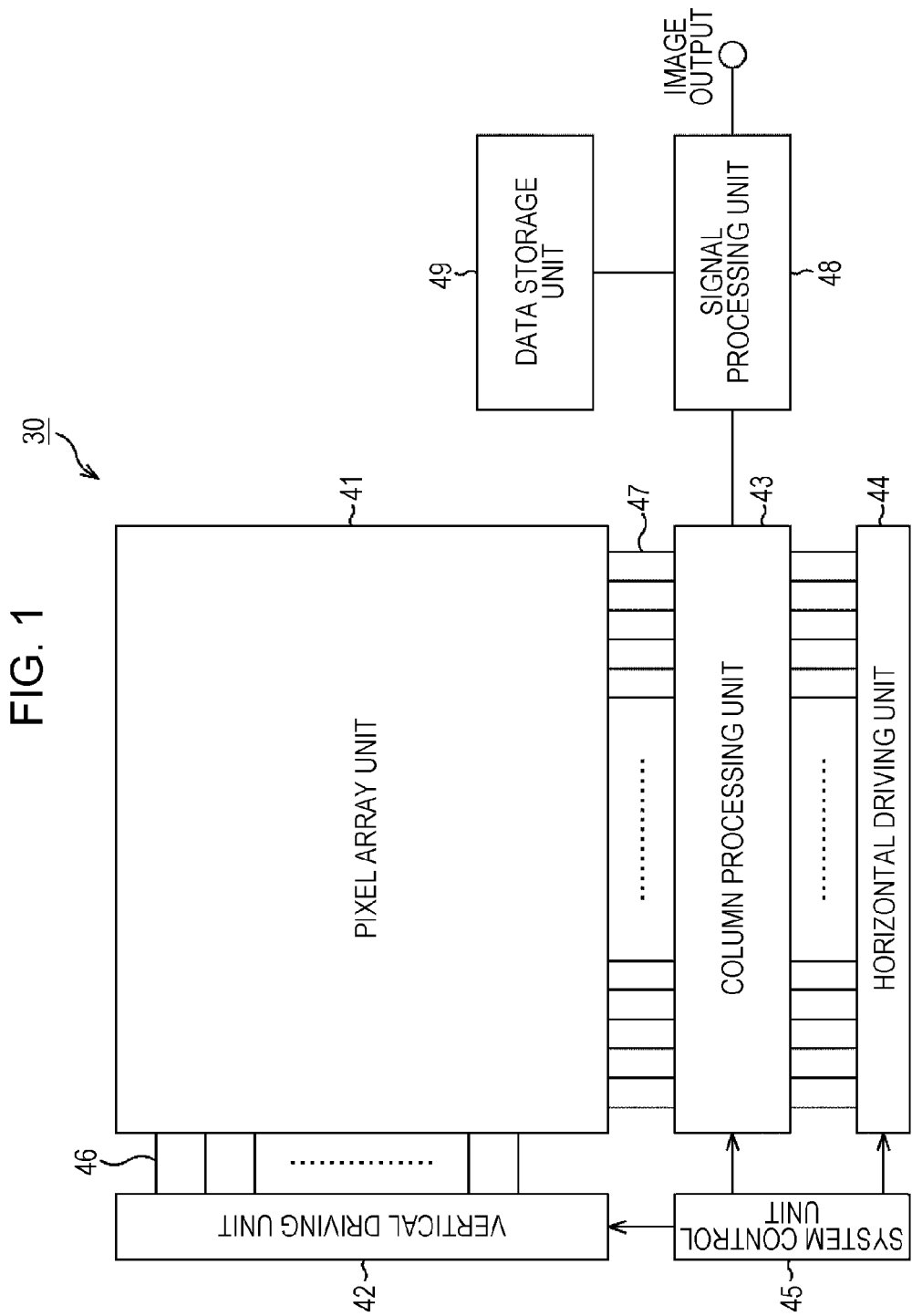
FIG. 1 is a diagram illustrating the configuration of an image sensor.

The description will be made in the following order.
1. Configuration of Solid-state Imaging element
2. Configuration of Unit Pixel
3. 1-1st Embodiment of Unit Pixel
4. 1-2nd Embodiment of Unit Pixel
5. Configuration of Upper Surface of Unit Pixel
6. Manufacturing Process
7. Second Embodiment of Unit Pixel
8. Third Embodiment of Unit Pixel
9. Fourth Embodiment of Unit Pixel
10. Fifth Embodiment of Unit Pixel
11. Sixth Embodiment of Unit Pixel
12. Seventh Embodiment of Unit Pixel
13. Electronic Apparatus Configuration of Solid-State Imaging Element FIG. 1 is a block diagram illustrating an example of the configuration of a CMOS (Complementary Metal Oxide Semiconductor) image sensor as a solid-state imaging element to which an embodiment of the present technology is applied. A CMOS image sensor 30 includes a pixel array unit 41, a vertical driving unit 42, a column processing unit 43, a horizontal driving unit 44, and a system control unit 45. The pixel array unit 41, the vertical driving unit 42, the column processing unit 43, the horizontal driving unit 44, and the system control unit 45 are formed on a semiconductor substrate (not illustrated).

In the pixel array unit 41, unit pixels, including a photoelectric conversion element that produces a charge amount of optical charge corresponding to an amount of incident light and accumulates the amount of optical charge therein, are arranged in a 2-dimensional matrix form. Hereinafter, the charge amount of optical charge corresponding to the amount of incident light is simply referred to as "charge."

In the pixel array unit 41, a pixel driving line 46 is formed for each row in the left and right directions (an arrangement direction of the pixels of a pixel row) of the drawing and a vertical signal line 47 is formed for each column in the upper and lower directions (an arrangement direction of the pixels in a pixel column) of the drawing in the pixel arrangement of the matrix form. One end of the pixel driving line 46 is connected to an output end corresponding to each row of the vertical driving unit 42.

The CMOS image sensor 30 further includes a signal processing unit 48 and a data storage unit 49. The signal processing unit 48 and the data storage unit 49 may be configured as an external signal processing unit such as a DSP (Digital Signal Processor) provided in a separate substrate from the CMOS image sensor 30 or as software, or may, of course, be mounted on the same substrate as the CMOS image sensor 30.

The vertical driving unit 42 is a pixel driving unit that include a shift register or an address decoder and drives each pixel of the pixel array unit 41 so that the pixels are all simultaneously driven or are driven in units of rows or the like. Although a specific configuration is not illustrated, the vertical driving unit 42 is configured to include a reading scanning system and a flushing scanning system or a collective flushing system and a collective transmission system.

The reading scanning system selectively scans the unit pixels of the pixel array unit 41 in order, in the units of rows, to read signals from the unit pixels. In a case of row driving (rolling shutter operation), flushing scanning is performed earlier by a time of a shutter speed than reading scanning in reading rows subjected to the reading scanning by the reading scanning system. In a case of global exposure (global shutter operation), collective flushing is performed earlier by a time of a shutter speed than collective transmission.

By flushing, unnecessary charge is flushed (reset) from the photoelectric conversion elements of the unit pixels in the reading row. A so-called electronic shutter operation is performed by flushing (resetting) the unnecessary charge. Here, the electronic shutter operation refers to an operation of discarding the optical charge of the photoelectric conversion element and starting a new exposure (starting accumulation of optical charge).

A signal read through the reading operation by the reading scanning system corresponds to an amount of incident light after the immediately previous reading operation or the electronic shutter operation. In a case of row driving, a period from a reading timing by the immediately previous reading operation or a flushing timing by the electronic shutter operation to a reading timing by the current reading operation is an accumulation period (exposure period) of the optical charge in the unit pixel. In a case of global exposure, an accumulation period, also known as an exposure period, comprises a period of time from collective flushing to collective.

A pixel signal output from each unit pixel of the pixel row selectively scanned by the vertical driving unit 42 is supplied to the column processing unit 43 via each of the vertical signal lines 47. The column processing unit 43 performs predetermined signal processing on the pixel signal output from each unit pixel in the selected row via the vertical signal line 47 for each pixel row of the pixel array unit 41 and temporarily retains the pixel signal subjected to the signal processing.

Specifically, the column processing unit 43 performs at least a noise removal process such as a CDS (Correlated Double Sampling) process as the signal processing. Fixed pattern noise unique to the pixel, such as reset noise or noise due to a variation of a threshold value of an amplification transistor, is removed through the correlated double sampling process by the column processing unit 43. Further, the column processing unit 43 may have, for example, an AD (analog-digital) conversion function to output a signal level as a digital signal in addition to the noise removal process.

The horizontal driving unit 44 includes a shift register and/or an address decoder and sequentially selects the unit circuits corresponding to the pixel columns of the column processing unit 43. When the horizontal driving unit 44 performs the selective scanning, the pixel signals subjected to the signal processing by the column processing unit 43 are sequentially output to the signal processing unit 48.

The system control unit 45 includes a timing generator that generates various timing signals and performs driving control on the vertical driving unit 42, the column processing unit 43, the horizontal driving unit 44, and the like based on the various timing signals generated by the timing generator.

The signal processing unit 48 includes at least an addition processing function and performs various kinds of signal processing such as an addition process on the pixel signals output from the column processing unit 43. The data storage unit 49 temporarily stores data necessary in signal processing when the signal processing unit 48 performs the signal processing.

Configuration of Unit Pixel

Next, a configuration of unit pixels 50 arranged in a matrix form in the pixel array unit 41 in FIG. 1 will be described. In the unit pixel 50 to be described below, a light-shielding film is provided to prevent, for example, an influence of light from a rear surface or an influence of light from a photodiode. Here, the influence of the light from the rear surface or the like will be described with reference to FIG. 2. A configuration realized to reduce the influence of the light from the rear surface will be described with reference to FIG. 3 and the subsequent drawings.

Figure 2:
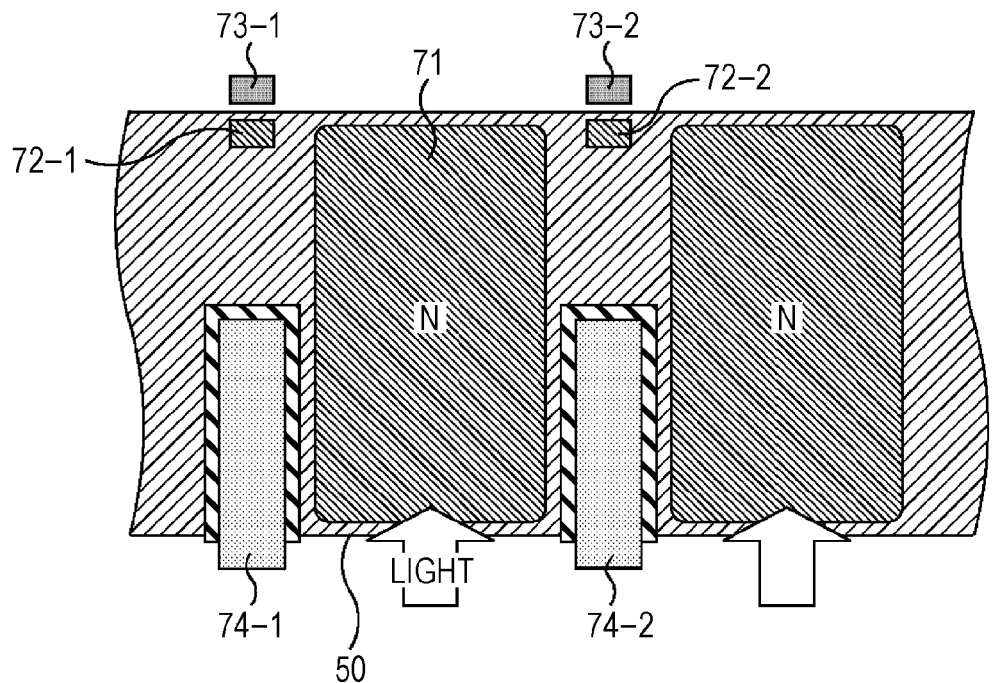
FIG. 2 is a cross-sectional view illustrating the configuration of a unit pixel.

FIG. 2 illustrates a perspective diagram when viewed from the side surface of the unit pixel 50. In the following description, a surface of the unit pixel 50 on the upper side of the drawing is referred to as an upper surface and a surface of the unit pixel 50 on the lower side is referred to as a lower substrate or a rear surface. The unit pixel 50 includes, for example, a photodiode 71 as a photoelectric conversion element. The photodiode 71 is, for example, an embedded photodiode that is formed by forming a p-type layer in a p-type well layer formed on an n-type substrate on the front surface side of the substrate and embedding an n-type embedded layer.

An accumulation electrode 73-1 is formed on the upper surface of the unit pixel 50 and a charge accumulation unit 72-1 is formed at the lower side of the accumulation electrode 73-1. At the lower side of the charge accumulation units 72 and at the side surfaces of the photodiode 71, light-shielding films 74-1 and 74-2 are formed from the rear surface. An insulation film is formed in each of the peripheries of the light-shielding films 74-1 and 74-2.

The unit pixel 50 illustrated in FIG. 2 is a rear-surface illumination type sensor. The rear-surface illumination type will be described. In general, since a CMOS image sensor is a rolling shutter type sensor that sequentially reads pixels, an image may be distorted due to a difference in an exposure timing. As a remedy against this problem, a global shutter type in which all of the pixels are simultaneously read by forming charge retention units in pixels has been suggested. According to the global shutter type, after all of the pixels are simultaneously read to the charge retention units, the pixels can sequentially be read. Therefore, since an exposure timing may be common for each pixel, it is possible to suppress distortion that occurs in the image.

However, since it is necessary to form a charge retention region inside a pixel, the layout of the pixel may be restricted, and thus an aperture ratio may decrease. Additionally, there is a concern that the sensitivity of a photodiode may deteriorate or the capacities of the photodiode and the charge retention region may deteriorate. Further, there is a concern that optical noise may be an issue since light enters the charge retention region during charge retention. To suppress the occurrences of optical noise, it is necessary to reduce the size of the charge retention region, however, with a smaller charge retention region, there is a concern that the saturation capacity of the charge retention region may deteriorate due to the smaller size of the charge retention region.

As a remedy against the reduction in the sensitivity, a rear-surface illumination type sensor may be used. By using the rear-surface illumination type sensor, a wiring layer inside a pixel can be formed on the rear side of the sensor, and thus vignetting of incident light by the wiring layer can be suppressed. However, when the charge retention region is formed inside a pixel of the rear-surface illumination type sensor, the charge retention region is formed as the charge accumulation unit 72 at the front surface side of a substrate and is formed in a deep region of the substrate with respect to incident light, as illustrated in FIG. 2. Therefore, it may be difficult to prevent light from leaking into the charge accumulation unit 72.

In such a sensor, there is a possibility that the light leaking from the photodiode 71 may enter into the charge accumulation unit 72, when the photodiode 71 (photoelectric conversion unit) and the charge accumulation unit 72 (accumulation unit) are formed on the same substrate. When such a situation occurs, there is a possibility that a virtual image may occur causing image distortion.

To prevent such a situation, as described and illustrated in FIG. 2, a part of the substrate between the photodiode 71 and the charge accumulation unit 72 is trenched and a material that shields light is embedded in the trenched portion. The trenched portions and the materials embedded in the trenched portions are indicated by the light-shielding films 74-1 and 74-2 in FIG. 2.

However, as illustrated in FIG. 2, even in the configuration in which a part of the substrate is trenched and light directed toward the charge accumulation unit 72 is shielded, there is a possibility that the light directed toward the charge accumulation unit 72 may not be sufficiently shielded to prevent the light entering the charge accumulation unit 72, and thus image distortion may occur.

1-1St Embodiment of Unit Pixel

Figure 3:
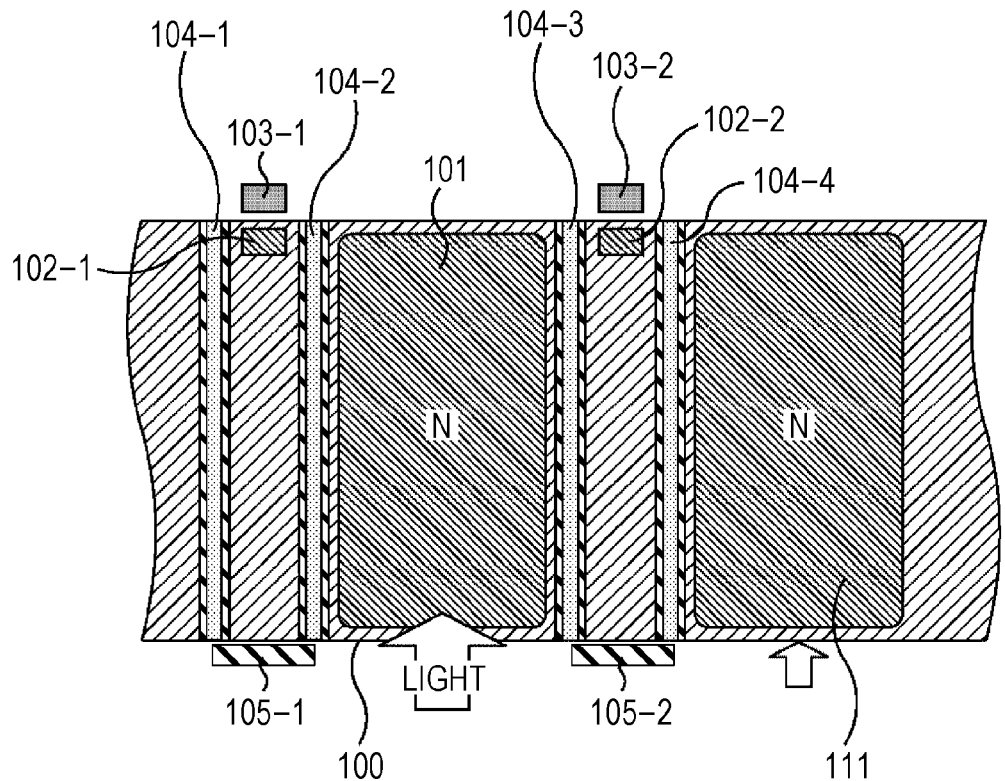
FIG. 3 is a cross-sectional view illustrating a unit pixel.

Accordingly, as illustrated in FIG. 3, the depth of a portion trenched from a light incident surface is sufficiently deep so that the charge accumulation unit 72 is completely covered. As in the unit pixel 50 illustrated in FIG. 2, a unit pixel 100 illustrated in FIG. 3 includes a photodiode 101, charge accumulation units 102-1 and 102-2, and accumulation electrodes 103-1 and 103-2. The photodiode 101, the charge accumulation units 102, and the accumulation electrodes 103 are arranged at the same positions as the photodiode 71, the charge accumulation units 72, and the accumulation electrodes 73 of the unit pixel 50 illustrated in FIG. 2.

In the unit pixel 100 illustrated in FIG. 3, first, light-shielding films 104-1 and 104-2 are formed on the left side of the photodiode 101 in the drawing. The light-shielding film 104-1 is sandwiched between in an insulation film. Likewise, the light-shielding film 104-2 is sandwiched in the insulation film. Further, light-shielding films 104-3 and 104-4 are formed on the right side of the photodiode 101 in the drawing. Each of the light-shielding films 104-3 and 104-4 is sandwiched in an insulation film.

In the following description, when it is not necessary to distinguish the light-shielding films 104-1 to 104-4 from each other, the light-shielding films 104-1 to 104-4 are described simply as the light-shielding films 104. The description of other portions will be made likewise.

The light-shielding films 104 are formed to penetrate from the upper surface to the lower surface of the unit pixel 100. As illustrated in FIG. 3, the charge accumulation unit 102 is located between the light-shielding films 104. In other words, the light-shielding film 104 is formed between the photodiode 101 and the charge accumulation unit 102. Accordingly, it is possible to prevent light from leaking from the photodiode 101 to the charge accumulation unit 102.

In the unit pixel 100 illustrated in FIG. 3, light-shielding films 105-1 and 105-2 are further formed. The light-shielding films 105 are formed on the rear surface of the unit pixel 100. The size of the light-shielding film 105 is set to be substantially the same as the size of a gap between two light-shielding films 104. The light-shielding film 105-1 is formed between the light-shielding films 104-1 and 104-2 and the light-shielding film 105-2 is formed between the light-shielding films 104-3 and 104-4.

The light-shielding film 105 is formed at the lower side of the charge accumulation unit 102 to surround the charge accumulation unit 102 together with the light-shielding films 104. A configuration is realized in which the charge accumulation unit 102 is surrounded in a U shape by the light-shielding films 104 and the light-shielding film 105. In other words, the light-shielding film 105 is formed as a cover between the light-shielding films 104.

Thus, by forming the light-shielding film 105, it is possible to prevent light from the rear surface of the unit pixel 100 from entering the charge accumulation unit 102.

Since the number of processes for forming the light-shielding films 104 and 105 may be small, the light-shielding films 104 and 105 can be formed relatively easily. For example, the light-shielding films 104 can be formed by trenching the substrate downward (trenching the substrate upward) from the upper surface or the lower surface to penetrate through the substrate and filling the trenched portion with a light-shielding material. Then, by forming the light-shielding films 105 on the lower surface, it is possible to form the light-shielding films in the U shape, as illustrated in FIG. 3.

Thus, by forming the light-shielding films 104 and 105, it is possible to reduce an occurrence of a dark current while preventing stray light from entering into the charge accumulation units 102. Further, since the number of processes for forming the light-shielding films 104 and 105 may be small, the processes themselves are prevented from becoming complicated.

1-2nd Embodiment of Unit Pixel

Next, another configuration of the unit pixel will be described with reference to FIG. 4. Since the arrangement of the electrodes and the like of a unit pixel 150 illustrated in FIG. 4 is the same as that of the unit pixel 100 illustrated in FIG. 3, the description will continue appropriately in comparison to the unit pixel 100 illustrated in FIG. 3.

Figure 4:
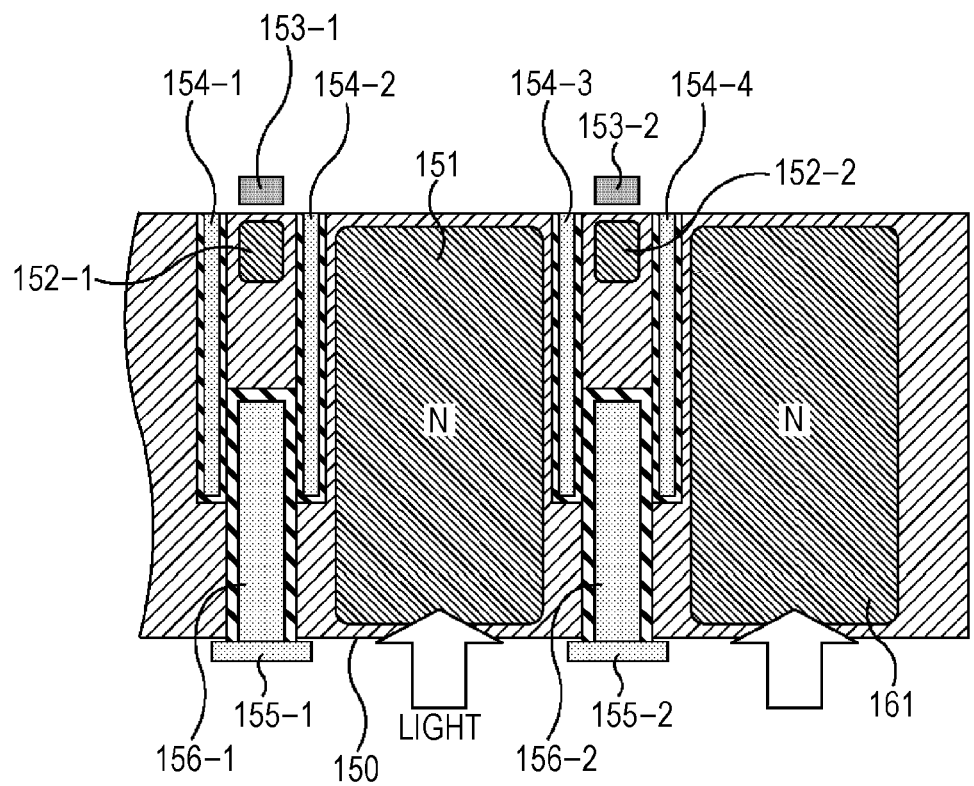
FIG. 4 is a cross-sectional view illustrating a unit pixel.

As in the unit pixel 100 illustrated in FIG. 3, the unit pixel 150 illustrated in FIG. 4 includes a photodiode 151, charge accumulation units 152-1 and 152-2, and accumulation electrodes 153-1 and 153-2. The photodiode 151, the charge accumulation units 152, and the accumulation electrodes 153 are formed at the same respective positions as the photodiode 101, the charge accumulation units 102, and the accumulation electrodes 103 of the unit pixel 100 illustrated in FIG. 3.

In the unit pixel 150 illustrated in FIG. 4, first, light-shielding films 154-1 and 154-2 are formed on the left side of the photodiode 151 in the drawing. Each of the light-shielding films 154-1 and 154-2 is sandwiched in an insulation film. Further, light-shielding films 154-3 and 154-4 are formed on the right side of the photodiode 151 in the drawing. Each of the light-shielding films 154-3 and 154-4 is sandwiched in an insulation film.

The light-shielding films 104 of the unit pixel 100 illustrated in FIG. 3 are formed to penetrate from the upper surface to the lower surface. The light-shielding films 154 of the unit pixel 150 illustrated in FIG. 4 are the same in that the light-shielding films 154 are formed from the upper surface and the lower surface. However, the light-shielding films 154 are different in that the light-shielding films 154 are formed such that they penetrate substantially up to halfway through the substrate; that is, a portion of the substrate is not penetrated by the light-shielding films 154 the. Stated another way, the light-shielding films 154 are formed in a lower surface direction from the upper surface and are disposed up to halfway through the substrate. To complement the non-penetrating portions of the substrate, light-shielding films 156-1 and 156-2 are formed in the unit pixel 150.

The light-shielding films 156 are light-shielding films formed in an upper surface direction from the lower surface and are disposed up to halfway through the substrate to be alternately arranged between one or more light-shielding films 154. The light-shielding films 156 are also formed such that the periphery thereof is covered with the insulation films. Further, light-shielding films 155 are formed on the lower surfaces of the light-shielding films 156.

By forming the light-shielding films 154 between the photodiode 151 and the charge accumulation unit 152, it is possible to prevent light from leaking from the photodiode 151 to the charge accumulation unit 152. Further, since the light-shielding films 155 and 154 are formed at the lower side of the charge accumulation units 152, it is possible to prevent the stray light from the rear surface of the unit pixels from entering the charge accumulation units 152.

The light-shielding films 154 and 156 are disposed as to have a position relation (overlapping position relation) in which parts of the light-shielding films overlap with each other. Therefore, even when the light-shielding films 154 and 156 are formed only up to the halfway portions of the substrate, there are no portions in which the light-shielding films practically discontinue. Stated another way, light-shielding films 154 and 156 may be formed such that they are continuous; that is, gaps between light-shielding films 154 and 156 are minimized. As in the case in which the light-shielding films are continuously formed, it is possible to prevent stray light from entering the charge accumulation unit 152.

Since the number of processes for forming the light-shielding films 154 to 156 may be small, as apparent from the description of a manufacturing process to be described below, the light-shielding films 154 to 156 can be formed relatively easily.

Thus, by forming the light-shielding films 154 and 155, it is possible to reduce an occurrence of a dark current while preventing stray light from entering into the charge accumulation unit 152. Further, since the number of processes of forming the light-shielding films 154 and 155 is not numerous, the processes themselves are prevented from becoming complicated.

Configuration of Upper Surface of Unit Pixel

The unit pixel 100 illustrated in FIG. 3 and the unit pixel 150 illustrated in FIG. 4 are different from each other in the method of forming the light-shielding films, but have the same configuration. When viewed from the upper surface, the unit pixels 100 and 150 have the configuration illustrated in FIG. 5. Here, the description will be made using the unit pixel 150 as an example.

Figure 5:
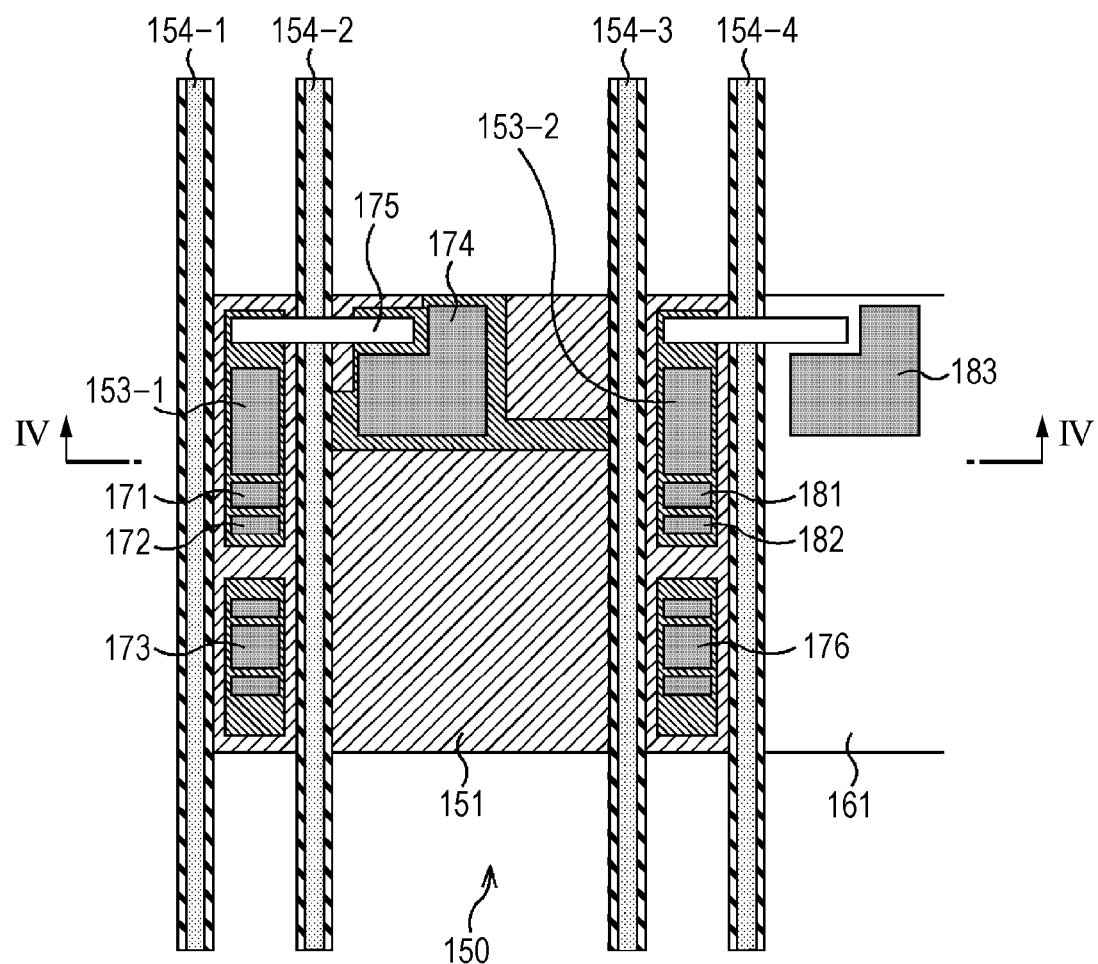
FIG. 5 is a diagram illustrating the configuration of the unit pixel.
Figure 6:
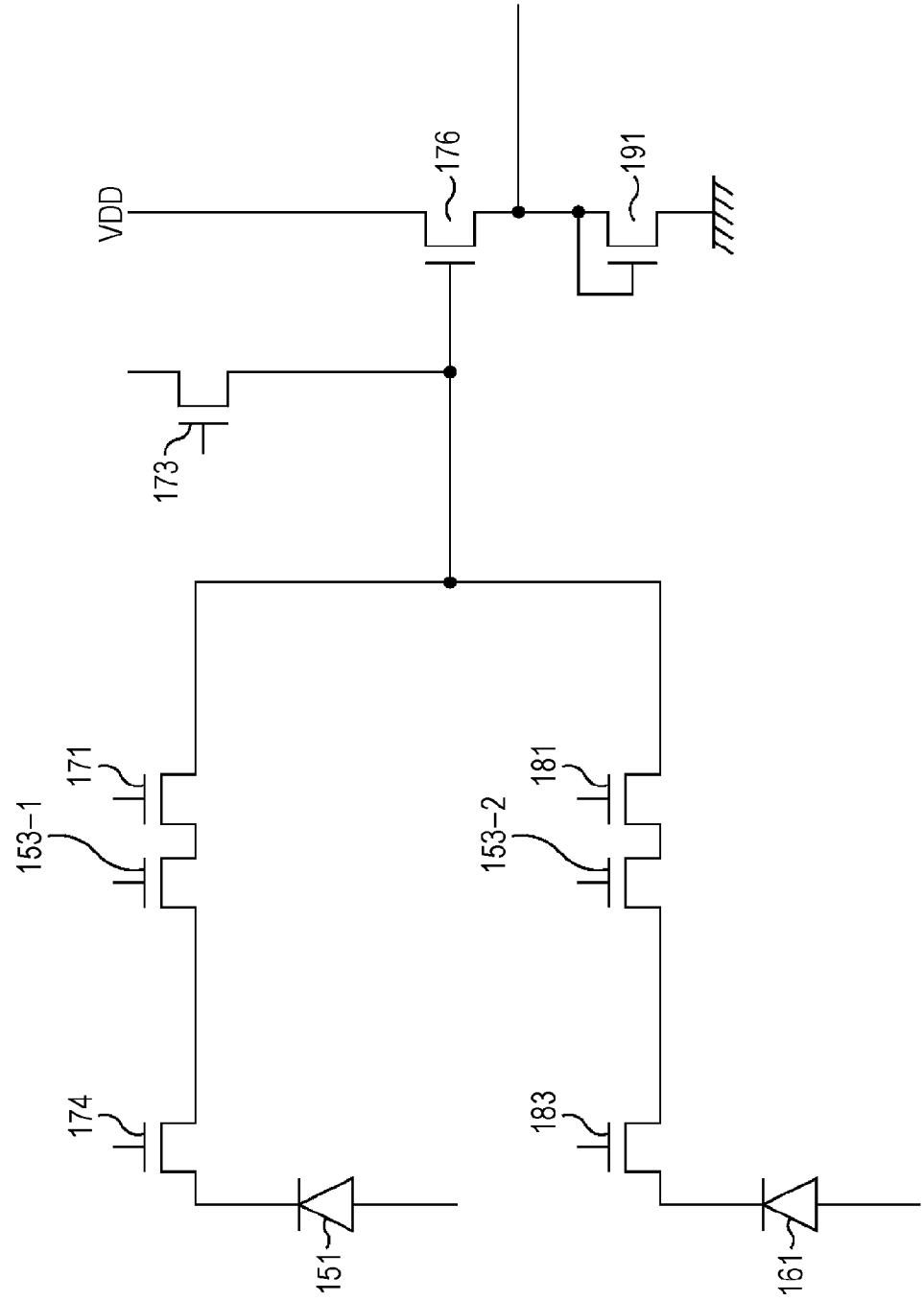
FIG. 6 is a circuit diagram illustrating the unit pixel.

FIG. 5 is a diagram illustrating the configuration of the unit pixel 150 illustrated in FIG. 4, when viewed from the upper surface (which is an opposite surface to a light-reception surface). FIG. 6 is a circuit diagram illustrating the unit pixel 150 illustrated in FIG. 5. The configuration illustrated in FIGS. 5 and 6 is a 2-pixel sharing configuration. Here, the description will continue on the assumption that the photodiode 151 and a photodiode 161 located on the right side of the photodiode 151 share a reset gate and the like.

The unit pixel 150 includes the photodiode 151 in the middle portion. However, since the P region is present when viewed from the upper surface, the photodiode 151 is not viewed directly. In FIG. 5, however, the reference numeral is given to show the position relation with the other portions. A memory unit (MEM) 153-1 is disposed on the left side of the photodiode 151 in the drawing. The memory unit 153-1 corresponds to the accumulation electrode 153-1 in FIG. 4.

A floating gate (FG) 171, a floating diffusion region (FD) 172, and a reset gate (RST) 173 are disposed in a line on the lower side of the memory unit 153-1. The description will continue on the assumption that the reset gate 173 is shared by the photodiodes 151 and 161.

A transfer gate (TG) 174 is disposed in a part of the photodiode 151. A wiring 175 is disposed in such a manner as to connect the transfer gate 174 to the memory unit 153-1. A memory unit 153-2, a floating gate 181, and a floating diffusion region 182 for the photodiode 161 disposed on the right side of the photodiode 151 are formed at the right side of the photodiode 151. An amplification transistor (AMP: amplifier) 176 is formed at the lower side of the floating diffusion region 182. The amplification transistor 176 is shared by the photodiodes 151 and 161, when shared by a plurality of photodiodes.

The transfer gate 174 of the unit pixel 150 having the above-described configuration transfers charge photoelectrically converted by the photodiode 151 and accumulated in the photodiode 151 to the memory unit 153-1 via the wiring 175, when a driving signal is applied to a gate electrode. Likewise, a transfer gate 183 transfers charge photoelectrically converted by the photodiode 161 and accumulated in the photodiode 161 to the memory unit 153-2 via a wiring 184, when a driving signal is applied to a gate electrode.

The memory unit 153-1 is shielded from light by the light-shielding films 154-1 and 154-2. As illustrated in FIG. 5, the light-shielding films 154-1 and 154-2 are formed to surround the memory unit 153-1. Therefore, the memory unit 153-1 is shielded from light by the light-shielding films 154. As illustrated in FIG. 5, the light-shielding films 154 are sandwiched in the insulation film.

Thus, since the light-shielding film 154-2 is formed between the photodiode 151 and the memory unit 153-1, the charge from the photodiode 151 is transferred via the wiring 175. As will be described below in detail, the wiring 175 may not be formed by omitting parts of the insulation film and the light-shielding film 154 and forming a transfer gate in the omitted portion.

The floating gate 171 of the unit pixel 150 transfers the charge accumulated in the memory unit 153-1 to the floating diffusion region 172, when a driving signal is applied to the gate electrode of the floating gate 171. The floating diffusion region 172 is a charge voltage conversion unit formed of an n-type layer and converts the charge transferred from the memory unit 153-1 into a voltage under the control of the floating gate 171.

The unit pixel 150 further includes the reset gate 173 and the amplification transistor 176 shared by the photodiode 161. The reset gate 173 is connected between a power supply and the floating diffusion region 172, and thus resets the floating diffusion region 172 and the floating diffusion region 182, when a driving signal is applied to a gate electrode.

A drain electrode and a gate electrode of the amplification transistor 176 are connected to the power supply and the floating diffusion region 172, respectively, and the amplification transistor 176 reads the voltage of the floating diffusion region 172. Although not illustrated in the drawing, the unit pixel 150 also includes a select transistor. For example, a drain electrode and a source electrode of the select transistor are connected to a source electrode of the amplification transistor 176 and the vertical signal line 47 (FIG. 1), respectively, and the select transistor selects the unit pixel 150 from which a pixel signal is to be read when a driving signal is applied to a gate electrode. The select transistor may be configured to be connected between the power supply and the drain electrode of the amplification transistor 176.

Thus, the CMOS image sensor 30 (FIG. 1) having the above-described configuration realizes the global shutter operation (global exposure) by starting simultaneous exposure of all the pixels, ending the simultaneous exposure of all the pixels, and transferring the charge accumulated in the photodiodes 151 to the memory units 153 shielded from light. Through the global shutter operation, an image with no distortion can be captured during an exposure period uniform in all of the pixels.

Manufacturing Process

Figure 8:
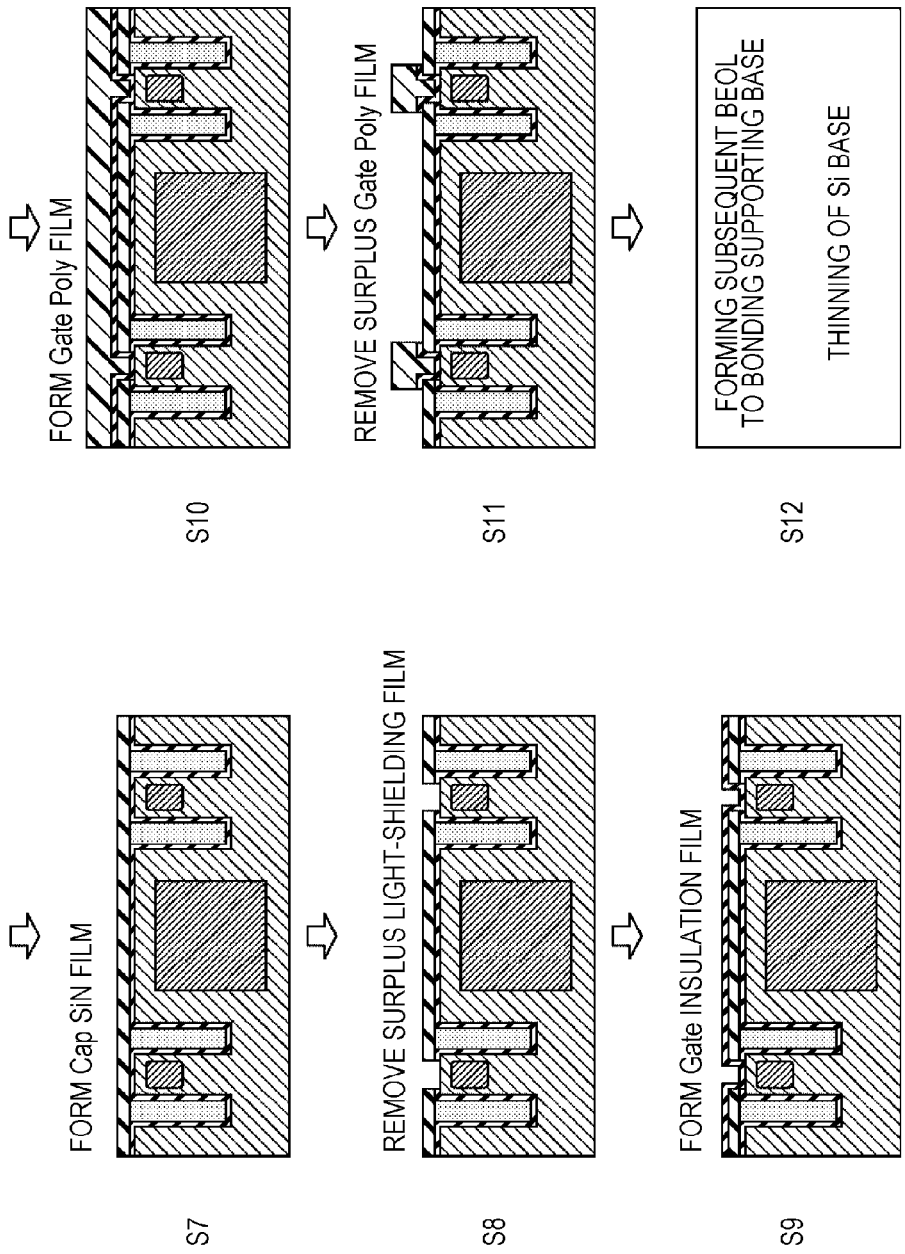
FIG. 8 is a diagram illustrating the manufacturing process.
Figure 9:
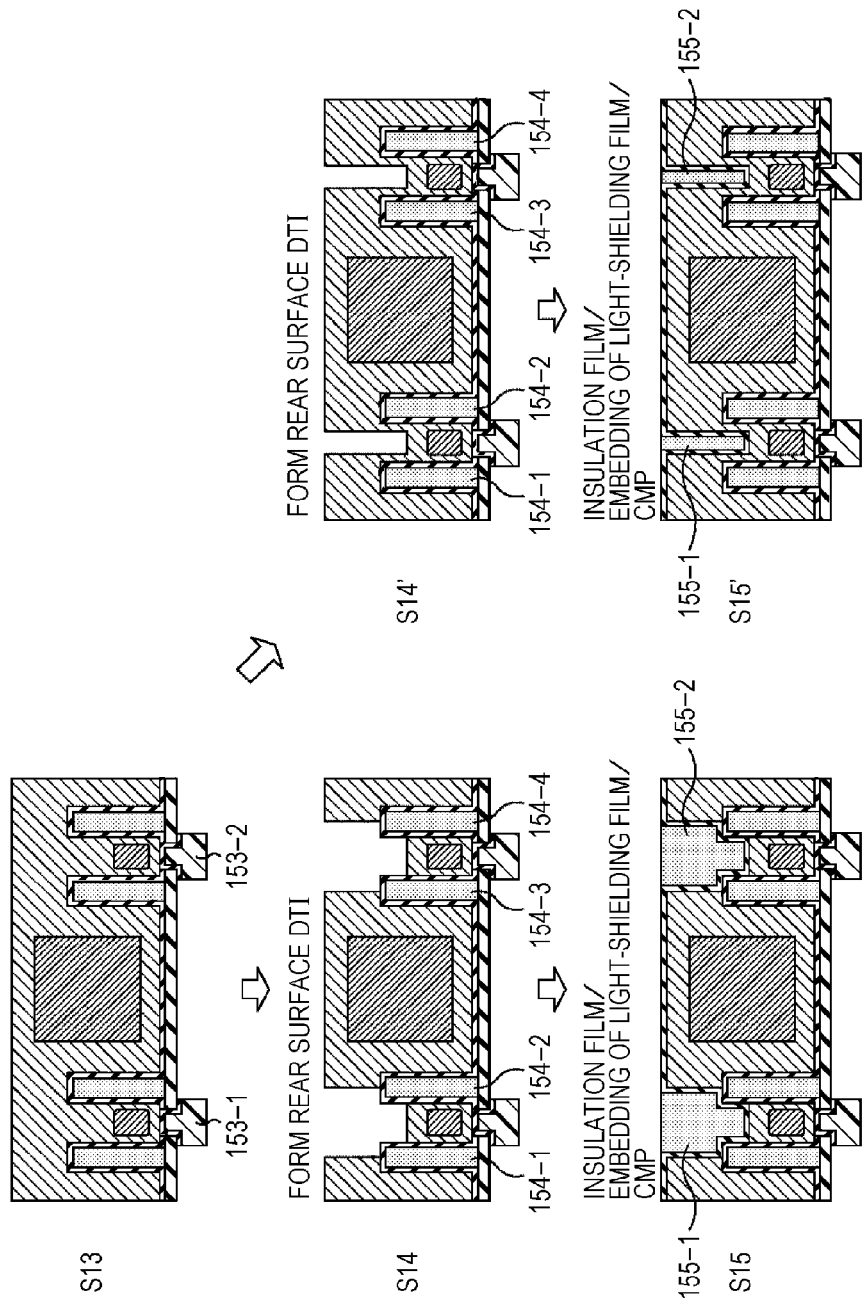
FIG. 9 is a diagram illustrating the manufacturing process.

A process of manufacturing the unit pixel illustrated in FIGS. 4 to 6 will be described with reference to FIGS. 7 to 9. The manufacturing process to be described with reference to FIGS. 7 to 9 is an example of a manufacturing process when the light-shielding films 154 are formed in the portions trenched from the upper surface of the unit pixel 150 and the light-shielding films 155 are formed in the portions trenched from the lower surface of the unit pixel 150, as illustrated in FIG. 4.

Figure 7:
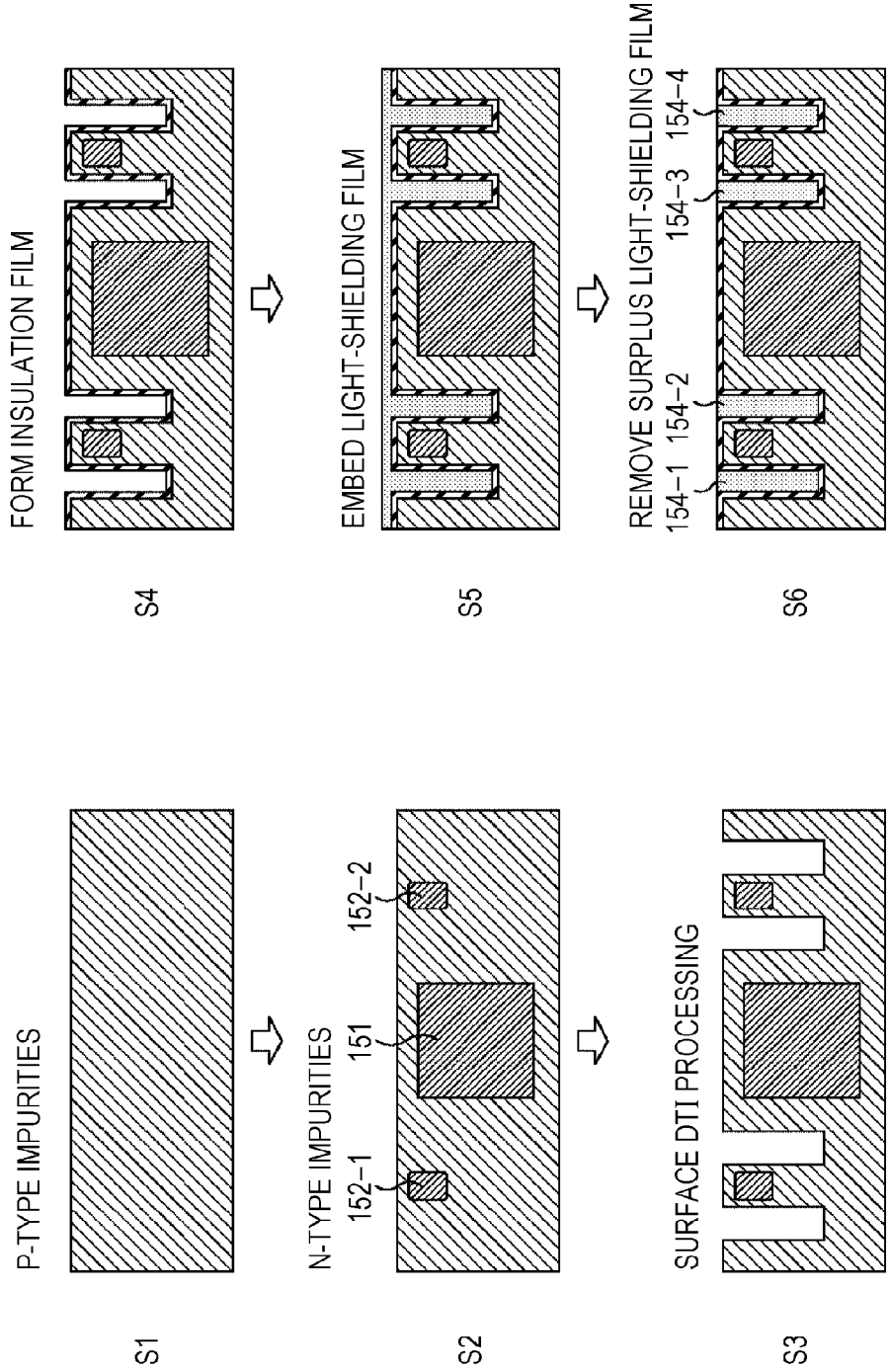
FIG. 7 is a diagram illustrating a manufacturing process.

In step S1 illustrated in FIG. 7, impurities that serve as P-type isolation regions are implanted to a Si substrate. In step S2, N-type impurities are implanted to regions that serve as the photodiode 151, the memory unit 153, and the transfer gate 174. In step S3, the light-shielding films 154 starts to be formed by trenching the unit pixel 150 from the upper surface of the unit pixel 150.

That is, in step S3, a surface DTI process is performed by forming the trenches in the portions in which the light-shielding films 154 are to be formed. Here, DTI is an abbreviation for Deep Trench Isolation, and DTI from the upper surface of the substrate is appropriately referred to as FDTI which is an abbreviation for Front side Deep Trench Isolation. Further, DTI from the lower surface (light-reception surface) side of the substrate is appropriately referred to as BDTI which is an abbreviation for Backside Deep Trench Isolation.

In step S3, the Si substrate is trenched by patterning the Si substrate using a lithography method and processing the Si substrate using a dry etching method to form the FDTI (the light-shielding films 154). Then, the insulation film is formed in step S4 and a metal material serving as a light-shielding material is embedded in step S5. In step S6, surplus portions of the Si front surface of the metal material embedded to form the light-shielding films 154 are removed by an etch back (EB) method. Thereafter, annealing is performed at 900° C. or more to reduce a dark current from the trenched portions.

In step S7 (FIG. 8), SiN (silicon nitride film) is formed to prevent the metal material from diffusing. In step S8, the surplus insulation film is removed. In step S9 to step S11, SiN/SiO$_2$ of a polySi electrode formation portion is removed by a lithography method and an etching method to form a poly Si gate (poly silicon gate), and then a gate insulation film and the poly Si are formed/processed, and thus the gate electrode is formed.

In step S12 and step S13 (FIG. 9), an upper layer wiring is formed (a BELO (Back End Of Line) is formed), a supporting base is bonded on the upper layer wiring, the wafer is reversed, the rear surface of the original substrate is brought to the front side, the surplus Si is polished, and thus a substrate thinned up to about 5 um is generated.

In step S14 and step S15, patterning is performed using a lithography method and the surplus Si is removed using a dry etching method to form the light-shielding films 155 (BDTI) from the lower surface of the unit pixel 150. Then, the insulation film is formed, as in the FDTI, a metal material is formed in the portion, and the surplus insulation film is removed by an EB method.

A width with which the light-shielding film 155 is formed may be formed at a gap larger than a gap between two light-shielding films 154, as illustrated in step S14 and step S15 of FIG. 9. For example, the light-shielding film 155-1 is formed between the light-shielding films 154-1 and 154-2. The width of the light-shielding film 155-1 is formed as a width larger than the gap between the light-shielding films 154-1 and 154-2.

Thus, a light-shielding property can be improved by causing the width of the BDTI to be larger than the gap between two FDTIs, in other words, overlapping the width of the BDTI on the FDTIs in the horizontal direction.

Alternatively, as illustrated in step S14' and step S15' of FIG. 9, the width of the BDTI may be configured not to overlap on the FDTIs in the horizontal direction. The width of the BDTI illustrated in step S14' and step S15' of FIG. 9 is formed as a gap narrower than the gap between two FDTIs. For example, the light-shielding film 155-1 is formed between the light-shielding films 154-1 and 154-2. The width of the light-shielding film 155-1 is formed as a width narrower than the gap between the light-shielding films 154-1 and 154-2.

Thus, even when the BDTI is formed in this way, the light-shielding films are formed such that the BDTI overlaps with the FDTIs in the vertical direction, and thus the light-shielding performance does not deteriorate. Further, the light-shielding performance can be improved when the overlapping portion is enlarged in the vertical direction.

Although not illustrated in the drawing, the light-shielding property may be improved by directly connecting the BDTI to the FDTIs. That is, as illustrated in FIG. 3, the BDTI and the FDTIs may be continuously formed and may be formed as the straight-line light-shielding film 104 in the substrate. Such a light-shielding film 104 can be formed to penetrate through the substrate, for example, when the FDTI (the light-shielding film 104) is formed in step S3 to step S6. Further, the processes of step S14 and step S15 of FIG. 9 may be omitted. Accordingly, it is possible to reduce the number of processes.

Second Embodiment of Unit Pixel

Figure 10:
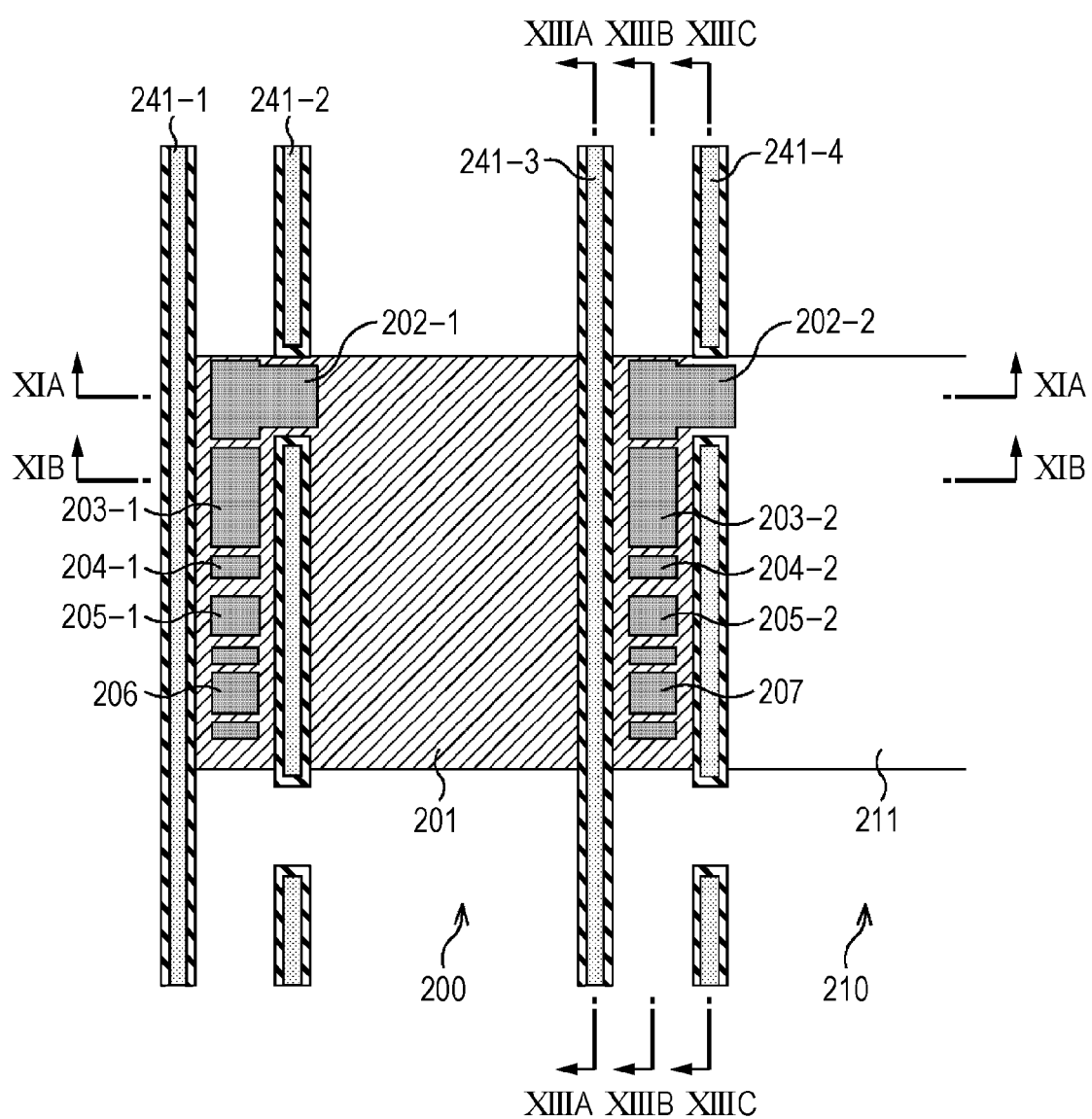
FIG. 10 is a diagram illustrating the configuration of a unit pixel.

In the first embodiment, the example in which the transfer gate 174 and the memory unit 153-1 are connected to each other via the wiring 175 has been described. In a second embodiment, however, a configuration in which the wiring 175 is omitted will be illustrated. FIG. 10 is a diagram illustrating the configuration of a unit pixel according to the second embodiment when the unit pixel is viewed from the upper surface (which is an opposite surface to a light-reception surface).

The configuration of a unit pixel 200 illustrated in FIG. 10 is basically the same as the configuration of the unit pixel 150 illustrated in FIG. 5. That is, the unit pixel 200 includes a photodiode 201, a transfer gate 202-1, a memory unit 203-1, a floating gate 204-1, a floating diffusion region 205-1, a reset gate 206, and an amplification transistor 207.

The unit pixel 200 illustrated in FIG. 10 is also a 2-pixel sharing type unit pixel. The reset gate 206 and the amplification transistor 207 are shared by photodiodes 201 and 211. The unit pixel 200 illustrated in FIG. 10 will be compared to the unit pixel 150 illustrated in FIG. 5.

As in the unit pixel 150 illustrated in FIG. 5, in the unit pixel 200 illustrated in FIG. 10, the memory unit 203-1, the floating gate 204-1, the floating diffusion region 205-1, and the reset gate 206 are disposed between light-shielding films 241-1 and 241-2. Likewise, a memory unit 203-2, a floating gate 204-2, a floating diffusion region 205-2, and an amplification transistor 207 are disposed between light-shielding films 241-3 and 241-4.

A part of the light-shielding film 241-2 is opened toward the photodiode 201, and the transfer gate 202-1 is formed in the opened portion. The transfer gate 202-1 can be configured to transfer the charge from the photodiode 201 to the memory unit 203-1 without passing through a wiring, when a part of the light-shielding film 241-2 is formed to be opened, such as shown by the part of the light-shielding film 241-2 that is open.

Likewise, in another unit pixel, for example, a unit pixel 210, a part of the light-shielding film 241-4 is opened toward the photodiode 211, and the transfer gate 202-2 is formed in the opened portion. Thus, a part of the light-shielding film can be opened and the transfer gate can be formed in the opened portion.

Thus, when the charge is configured to be transferred from the photodiode 201 to the memory unit 203-1 without using a wiring, the charge can be transferred on a silicon substrate and noise rarely occurs. Thus, it is possible to reduce an influence of the noise.

Figure 11A:
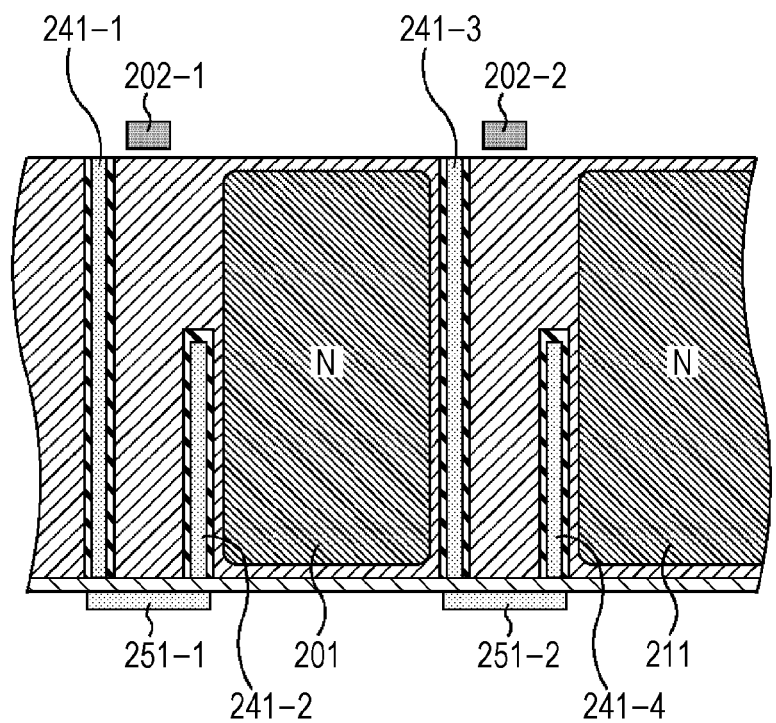
FIGS. 11A and 11B are cross-sectional views illustrating the unit pixel.
Figure 11B:
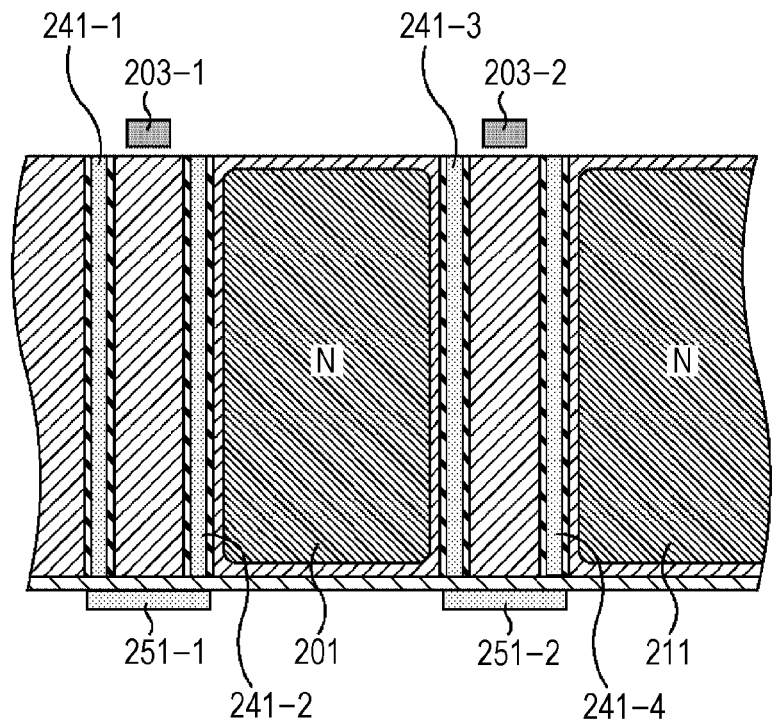

FIGS. 11A and 11B are cross-sectional views illustrating the unit pixel 200 illustrated in FIG. 10. FIG. 11A is the diagram when the unit pixel 200 illustrated in FIG. 10 is viewed from a side surface taken along the line XIA-XIA. FIG. 11B is the diagram when the unit pixel 200 illustrated in FIG. 10 is viewed from a side surface taken along the line XIB-XIB.

Since the side view illustrated in FIG. 11A illustrates a portion in which the transfer gate 202-1 is located, the light-shielding film 241-2 is formed upward from the lower surface of the unit pixel 200, but is configured not to be formed up to the upper surface and to be formed up to a halfway portion. Stated another way, the light-shielding film 241-2 is formed such that it extends upward from the lower surface of the unit pixel 200 up to substantially half the width of the substrate and/or a midpoint position of the substrate. With regard to the light-shielding film 241-2, the light-shielding film 241-1 is formed to penetrate from the lower surface to the upper surface of the unit pixel 200. Thus, the light-shielding film 241 in the portion in which the transfer gate 202 is formed is formed up to the halfway portion of the substrate and the other light-shielding film 241 is formed to penetrate through the substrate.

Since the side view illustrated in FIG. 11B illustrates a portion in which the transfer gate 202 is not located, the light-shielding films 241 are formed to penetrate from the lower surface to the upper surface of the substrate. The light-shielding films 241 are the same as, for example, the light-shielding films 104 described with reference to FIG. 3.

As illustrated in FIGS. 11A and 11B, a light-shielding film 251-1 is formed on the lower surface of the substrate between two light-shielding films 241, for example, between the light-shielding films 241-1 and 241-2. The light-shielding film 251 is the same as the light-shielding film 105 illustrated in FIG. 3 and is formed to reduce an influence of unnecessary and/or stray light from the rear surface side.

Figure 12A:
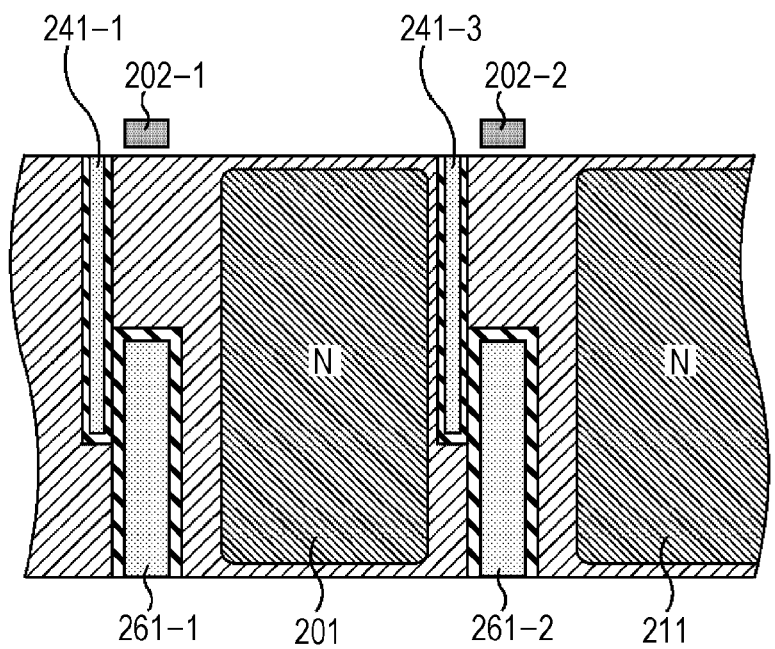
FIGS. 12A and 12B are cross-sectional views illustrating the unit pixel.
Figure 12B:
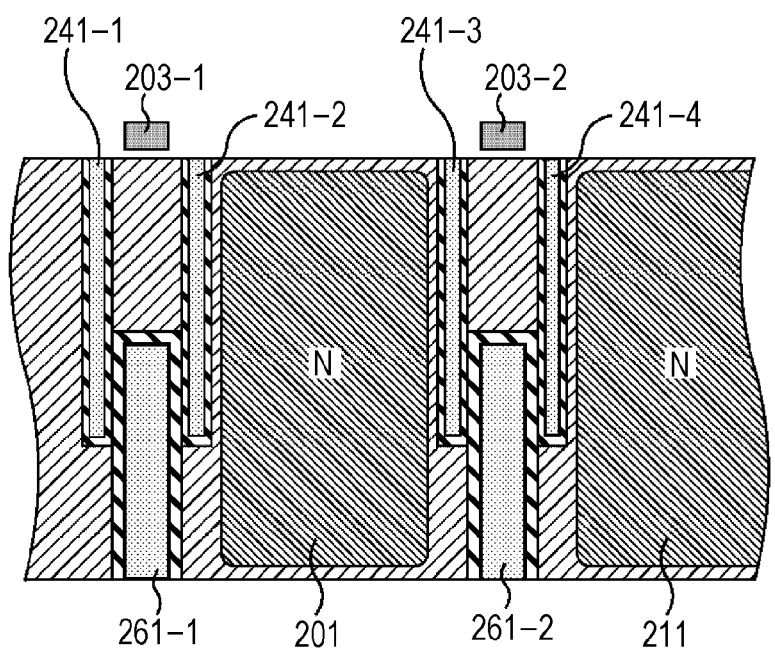

FIGS. 12A and 12B are diagrams illustrating the configuration of other light-shielding films 241. FIG. 12A is a side view illustrating a portion in which the transfer gate 202-1 is located, as in FIG. 11A. The light-shielding film 241-1 of the unit pixel 200 illustrated in FIG. 12A is configured to be formed up to a halfway portion of the substrate from the upper surface of the unit pixel 200 in the lower surface direction. With regard to the light-shielding film 241-1, the light-shielding film 241-2 is configured not to be formed. Thus, the light-shielding films 241 in the portion in which the transfer gate 202 is formed are not formed and the other light-shielding films 241 are formed up to the halfway portions of the substrate.

Since the side view illustrated in FIG. 12B illustrates a portion in which the transfer gate 202 is not located, the light-shielding films 241 are formed up to the halfway portions of the substrate from the upper surface of the substrate in the lower surface direction. The light-shielding films 241 are the same as, for example, the light-shielding films 154 described with reference to FIG. 4.

As illustrated in FIGS. 12A and 12B, light-shielding films 261 are formed from the lower surface of the unit pixel 200 in the upper surface direction. Thus, as in the case described with reference to FIG. 4, two light-shielding films 241 oriented from the upper surface to the lower surface of the substrate and the light-shielding film 261 formed between the two light-shielding films 241 are formed from the lower surface to the upper surface of the substrate. The light-shielding film 241 in the portion in which the transfer gate 202 is located is configured not to be formed.

As illustrated in FIGS. 11A and 11B or 12A and 12B, the light-shielding films are formed. In either case, the configuration is realized such that stray light can be prevented from entering into the memory unit 203.

Figure 13A:
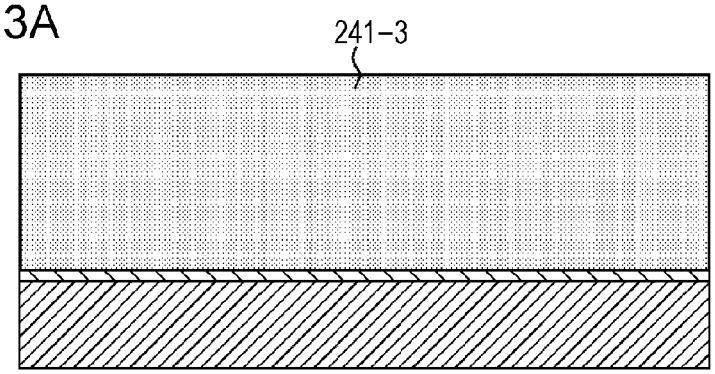
FIGS. 13A to 13C are side views illustrating the unit pixel.
Figure 13B:
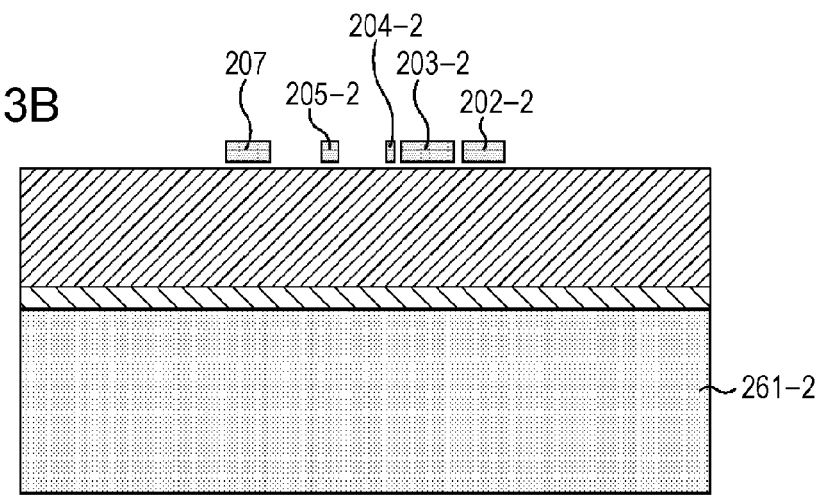
Figure 13C:
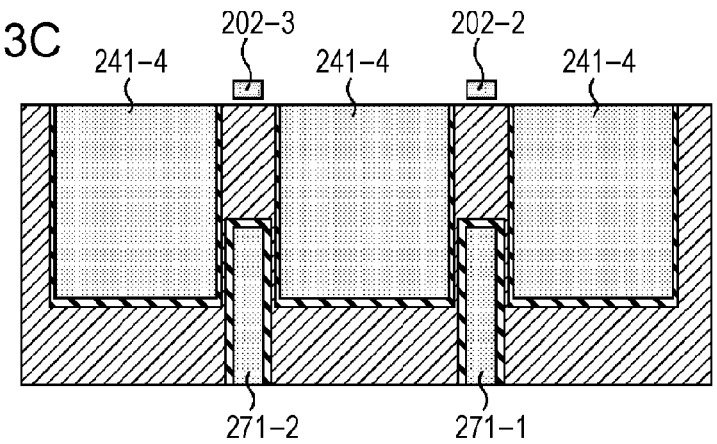

FIGS. 13A to 13C are side views illustrating the unit pixel 200 illustrated in FIG. 10 and side views when viewed from a different position from the position of FIG. 11A to FIG. 12B. FIG. 13A is the diagram when the unit pixel 200 illustrated in FIG. 10 is viewed from the side surface taken along the line XIIIA-XIIIA. FIG. 13B is the diagram when the unit pixel 200 illustrated in FIG. 10 is viewed from the side surface taken along the line XIIIB-XIIIB. FIG. 13C is the diagram when the unit pixel 200 illustrated in FIG. 10 is viewed from the side surface taken along the line XIIIC-XIIIC.

As illustrated in FIG. 13A, the light-shielding film 241-3 formed between the photodiode 201 and the portion in which the memory unit 203-2 or the like is formed is formed up to a halfway portion from the upper surface of the substrate in the lower surface direction. The light-shielding film 241-3 is formed by performing trenching from the front surface of the substrate and filling the trenched portion with a light-shielding material. Further, an insulation film is formed between the light-shielding film 241-3 and the substrate.

As illustrated in FIG. 13B, in a portion in which the memory unit 203-2 and the like are formed and a portion between the light-shielding films 241-3 and 241-4, a light-shielding film 261-2 is formed up to a halfway portion from the lower surface of the substrate in the upper surface direction. The light-shielding film 261-2 is formed by performing trenching from the rear surface of the substrate and filling the trenched portion with a light-shielding material. Further, an insulation film is formed between the light-shielding film 261-2 and the substrate.

As illustrated in FIG. 13C, in the light-shielding film 241-4 formed between the photodiode 211 and the portion in which the memory unit 203-2 and the like is formed, there is a portion which is formed up to a halfway portion from the upper surface of the substrate and a portion which is not formed. The light-shielding film 241-4 is not formed in a portion in which the transfer gate 202-2 or the transfer gate 202-3 (not illustrated in FIG. 10) is located. On the other hand, the light-shielding film 241-4 is formed in a portion in which the transfer gate 202 is not located. The light-shielding film 241-4 is formed by performing trenching from the front surface of the substrate and filling the trenched portion with a light-shielding material. Further, an insulation film is formed between the light-shielding film 241-4 and the substrate.

A light-shielding film 271-1 is formed on the lower side of the transfer gate 202-2, in other words, in a portion in which the light-shielding film 241-4 is not present. Likewise, a light-shielding film 271-2 is formed on the lower side of the transfer gate 202-3. As in the light-shielding film 261 illustrated in FIG. 12B, the light-shielding films 271 are formed by performing trenching from the rear surface of the substrate and filling the trenched portions with a light-shielding material.

Thus, a configuration can be realized in which no light-shielding film is formed in the portion in which the transfer gate is formed and the transfer gate and the photodiode can transmit and receive the charge without passing through a wiring. Even in this configuration, it is possible to reduce the influence of stray light on the memory unit 203. Compared to a case in which a wiring is used, it is possible to suppress a dark current occurring from a portion in which the Si substrate and the wiring are bonded, and thus to obtain an image with less noise.

Third Embodiment of Unit Pixel

Figure 14:
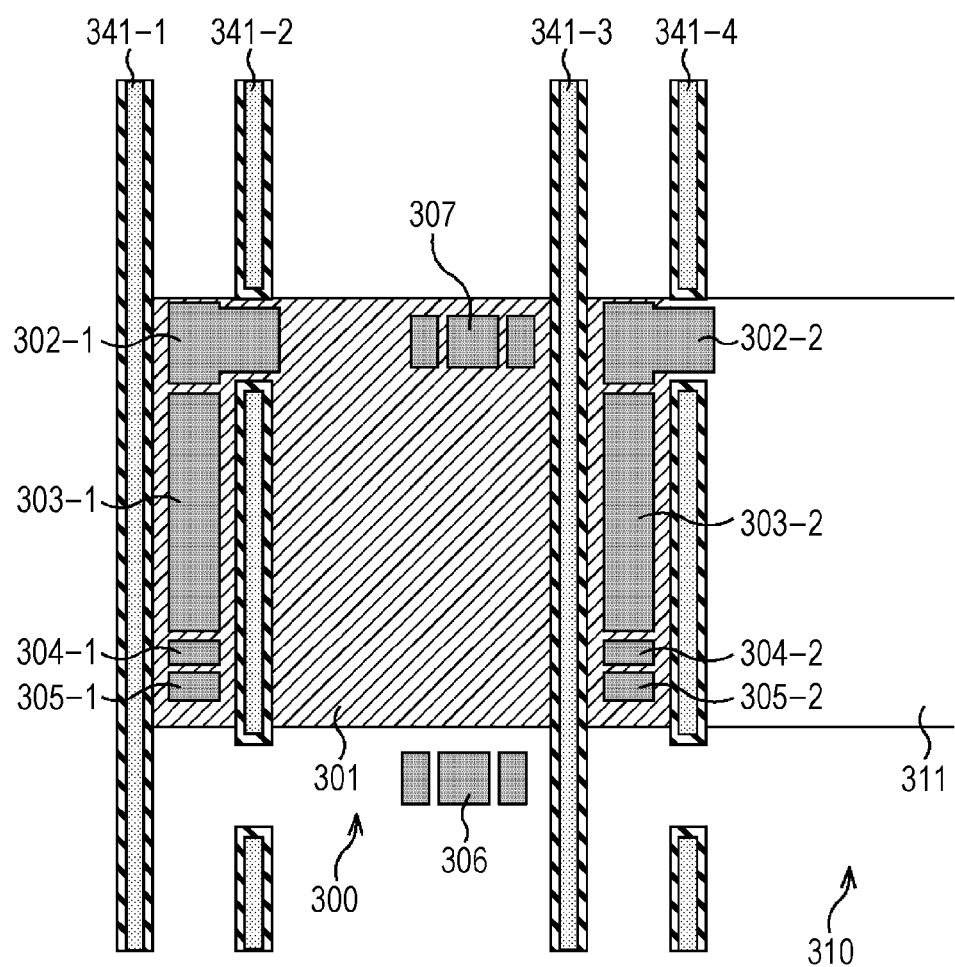
FIG. 14 is a diagram illustrating the configuration of a unit pixel.

FIG. 14 illustrates another configuration of a unit pixel. FIG. 14 is a diagram illustrating the configuration of the unit pixel when the unit pixel according to a third embodiment is viewed from the upper surface (which is an opposite surface to the light-reception surface). The configuration of a unit pixel 300 illustrated in FIG. 14 is basically the same as the configuration of the unit pixel 200 illustrated in FIG. 10. That is, the unit pixel 300 includes a photodiode 301, a transfer gate 302-1, a memory unit 303-1, a floating gate 304-1, a floating diffusion region 305-1, a reset gate 306, and an amplification transistor 307.

The unit pixel 300 illustrated in FIG. 14 is also a 2-pixel sharing type unit pixel. The reset gate 306 and the amplification transistor 307 are shared by photodiodes 301 and 311. The unit pixel 300 illustrated in FIG. 14 will be compared to the unit pixel 200 illustrated in FIG. 10.

The positions of the reset gate 306 and the amplification transistor 307 of the unit pixel 300 illustrated in FIG. 14 are different from the positions of the reset gate 206 and the amplification transistor 207 of the unit pixel 200 illustrated in FIG. 10. Referring back to FIG. 10, the reset gate 206 of the unit pixel 200 illustrated in FIG. 10 is configured to be present between the light-shielding films 241-1 and 241-2, and the amplification transistor 207 is configured to be preset between the light-shielding films 241-3 and 241-4.

On the other hand, the reset gate 306 and the amplification transistor 307 of the unit pixel 300 illustrated in FIG. 14 are formed not between light-shielding films but at positions different from the positions of the memory unit 303 and the like. The memory unit 303 and the like are located on the right side or the left side of the photodiode 301 in the drawing and are formed inside the light-shielding region interposed between two light-shielding films 341. The reset gate 306 is located on the upper side of the photodiode 301 in the drawing and the amplification transistor 307 is located on the lower side of the photodiode 301 in the drawing. That is, the reset gate 306 and the amplification transistor 307 are disposed outside of the light-shielding region.

The reset gate 306 or the amplification transistor 307 is turned on for a moment and the charge photoelectrically converted and accumulated by incident light immediately before the turned-on time is discharged. Therefore, even when the reset gate 306 or the amplification transistor 307 is disposed outside of the light-shielding region, the influence on other portions is considered to be small.

Further, by forming the reset gate 306 or the amplification transistor 307 outside of the light-shielding region and enlarging the size of the memory unit 303 formed inside the light-shielding region, it is possible to increase an amount of charge which can be accumulated.

Fourth Embodiment of Unit Pixel

Figure 15:
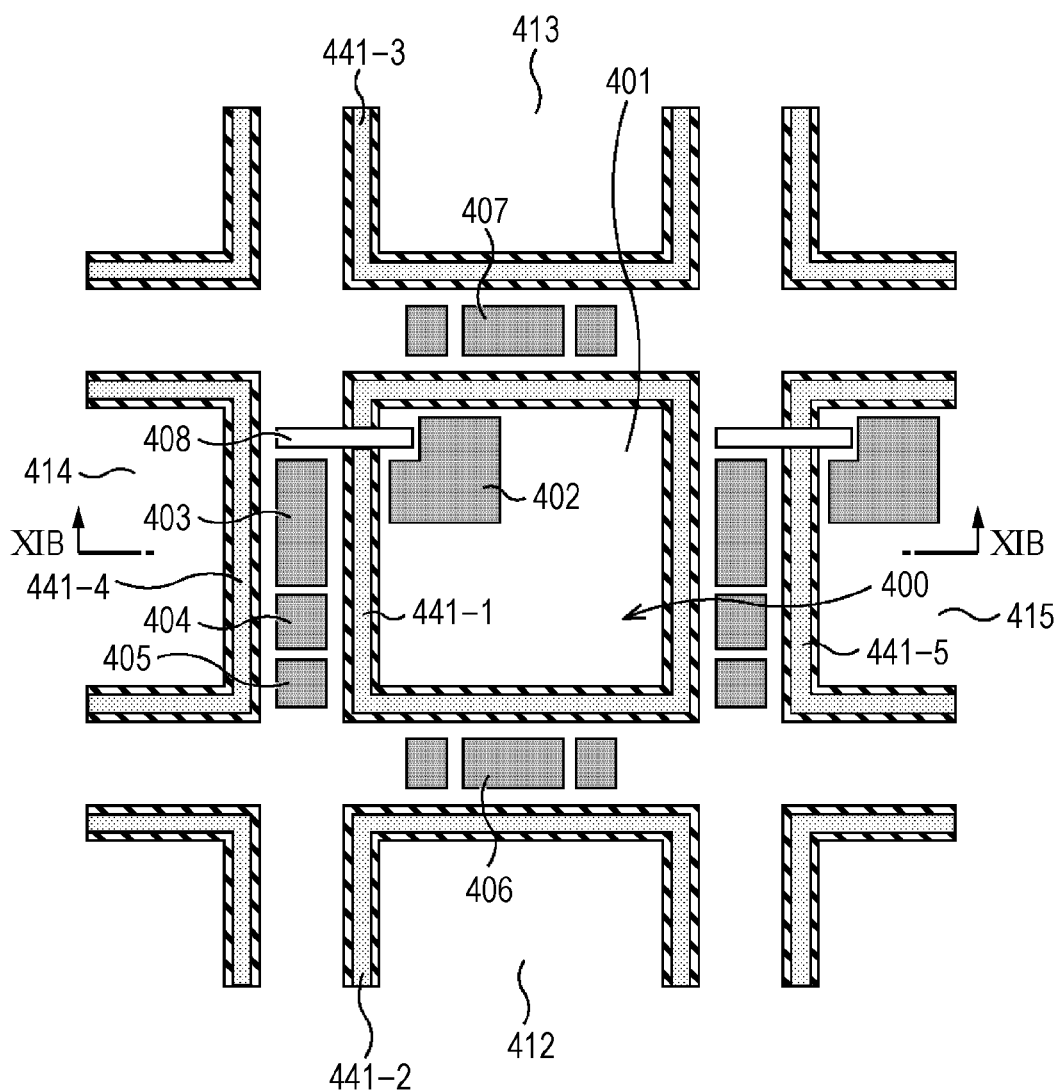
FIG. 15 is a diagram illustrating the configuration of a unit pixel.

FIG. 15 illustrates still another configuration of a unit pixel. FIG. 15 is a diagram illustrating the configuration of the unit pixel when the unit pixel according to a fourth embodiment is viewed from the upper surface (which is an opposite surface to the light-reception surface). That is, the unit pixel 400 illustrated in FIG. 15 includes a photodiode 401, a transfer gate 402-1, a memory unit 403-1, a floating gate 404-1, a floating diffusion region 405-1, a reset gate 406, and an amplification transistor 407.

The unit pixel 400 illustrated in FIG. 15 is also a 2-pixel sharing type unit pixel. The reset gate 406 and the amplification transistor 407 are shared by photodiodes 401 and 411. The arrangement of the respective units of the unit pixel 400 illustrated in FIG. 15 is basically the same as that of the unit pixel 300 illustrated in FIG. 14.

The reset gate 406 of the unit pixel 400 illustrated in FIG. 15 is formed on the lower side of the photodiode 401 and the amplification transistor 407 is formed on the upper side of the photodiode 401. In the unit pixel 400 illustrated in FIG. 15, the reset gate 406 and the amplification transistor 407 are also formed in light-shielding regions. That is, the reset gate 406 is formed inside the light-shielding region interposed between light-shielding films 441-1 and 441-2 and the amplification transistor 407 is formed in the light-shielding region interposed between light-shielding films 441-2 and 441-3.

The light-shielding films 441 are formed to surround the photodiode 401. In the above-described embodiments, the examples in which the light-shielding films are formed on two sides of the four sides of the photodiode have been described. For example, the light-shielding film 341-2 is formed on the left side of the photodiode 301 of the unit pixel 300 illustrated in FIG. 14 and the light-shielding film 341-3 is formed on the right side of the photodiode 301. However, light-shielding films are not formed on the upper and lower sides of the photodiode 301.

On the other hand, the light-shielding films illustrated in FIG. 15 are formed to surround the photodiode. For example, the light-shielding film 441-1 is formed to surround the photodiode 401. Likewise, a photodiode 412 located on the lower side of the photodiode 401 is surrounded by the light-shielding film 441-2 and a photodiode 413 located on the upper side of the photodiode 401 is surrounded by the light-shielding film 441-3.

Likewise, a photodiode 414 located on the left side of the photodiode 401 is surrounded by the light-shielding film 441-4 and a photodiode 415 located on the right side of the photodiode 401 is surrounded by the light-shielding film 441-5.

Thus, since each photodiode is surrounded by the light-shielding film, for example, the memory unit 403 is formed between the light-shielding films 441-1 and 441-4, and thus is formed inside a region shielded from light by the two light-shielding films. Accordingly, since stray light can be prevented from entering into the memory unit 403, a virtual image and/or distortion can be prevented.

By utilizing a rectangular shape to surround each photodiode (each pixel) with the light-shielding film, it is possible to prevent light from leaking between the pixels. That is, a mixed color between the pixels can be prevented.

Figure 16:
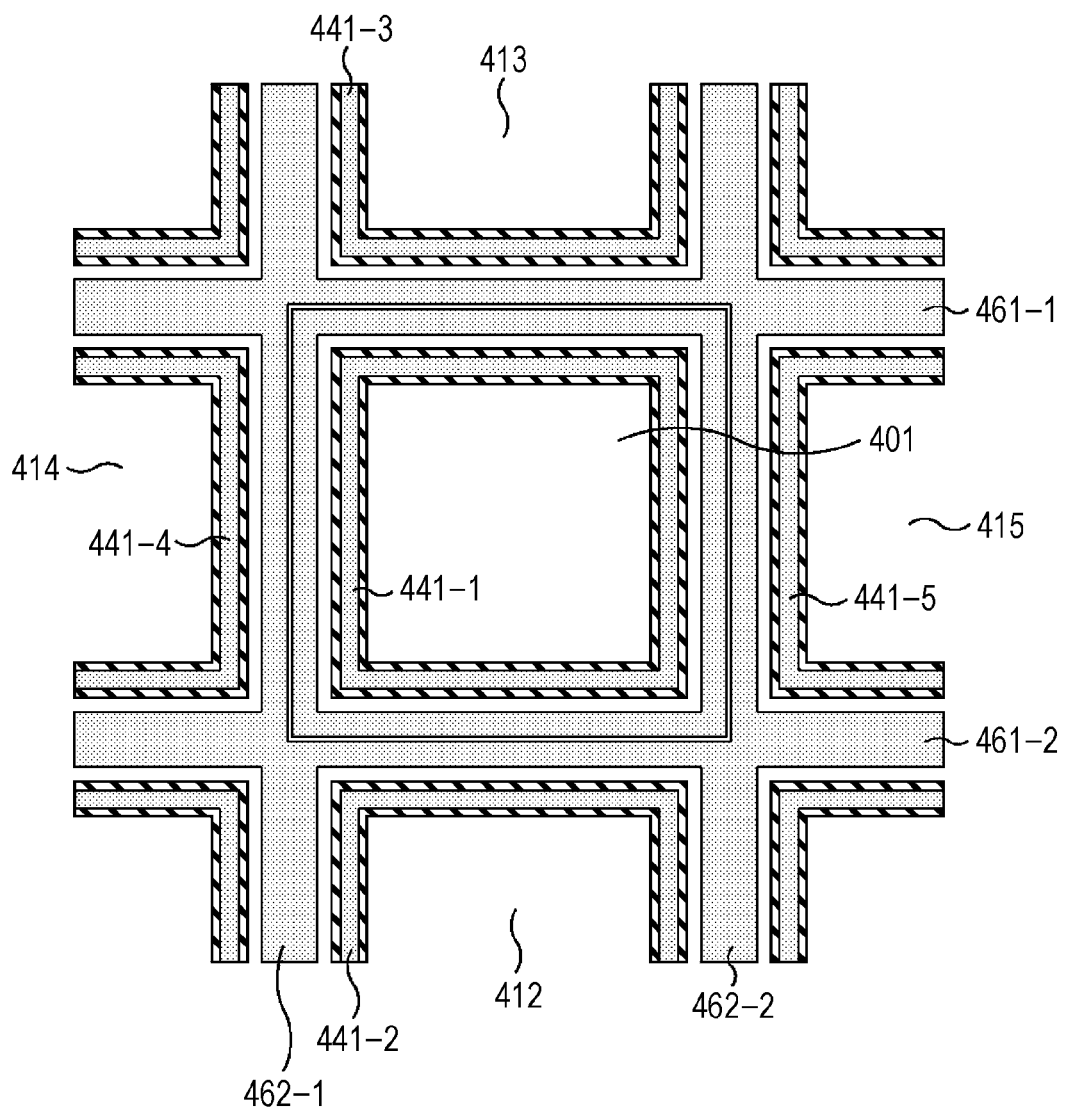
FIG. 16 is a diagram illustrating the configuration of the unit pixel.

FIG. 16 is a diagram illustrating the configuration of the unit pixel, when the unit pixel 400 is viewed from the lower surface (light-reception surface). As illustrated in FIG. 16, each photodiode is surrounded by a light-shielding film. A light-shielding film is formed even in a region interposed between two photodiodes, in other words, a region interposed between two light-shielding films.

For example, a light-shielding film 461-2 is formed between the light-shielding films 441-1 and 441-2, and a light-shielding film 461-1 is formed between the light-shielding films 441-1 and 441-3. In FIG. 16, light-shielding films 462-1 and 462-2 are also formed in the vertical direction. Thus, the light-shielding films 461 and 462 are formed in a cross form on the rear surface.

Thus, portions of the rear surfaces other than the photodiodes are covered with the light-shielding films. Accordingly, a configuration is realized such that stray light does not enter the photodiode and the memory unit 403.

The side view of the unit pixel 400 having the above-described configuration is configured as illustrated in, for example, FIG. 11B. When the unit pixel 400 illustrated in FIG. 15 is taken along the line XIB-XIB and is viewed from the side surface, the light-shielding films are formed, as illustrated in FIG. 11B. The light-shielding films may be formed, as illustrated in FIG. 3.

Thus, by forming the light-shielding film 441-1 to surround the photodiode 401, it is possible to prevent light from entering into the memory unit 403 and to prevent light from leaking between the pixels. Accordingly, it is possible to prevent a virtual image occurring due to the invasion of light into the memory unit 403 and to prevent a mixed color between the pixels.

Fifth Embodiment of Unit Pixel

Figure 17:
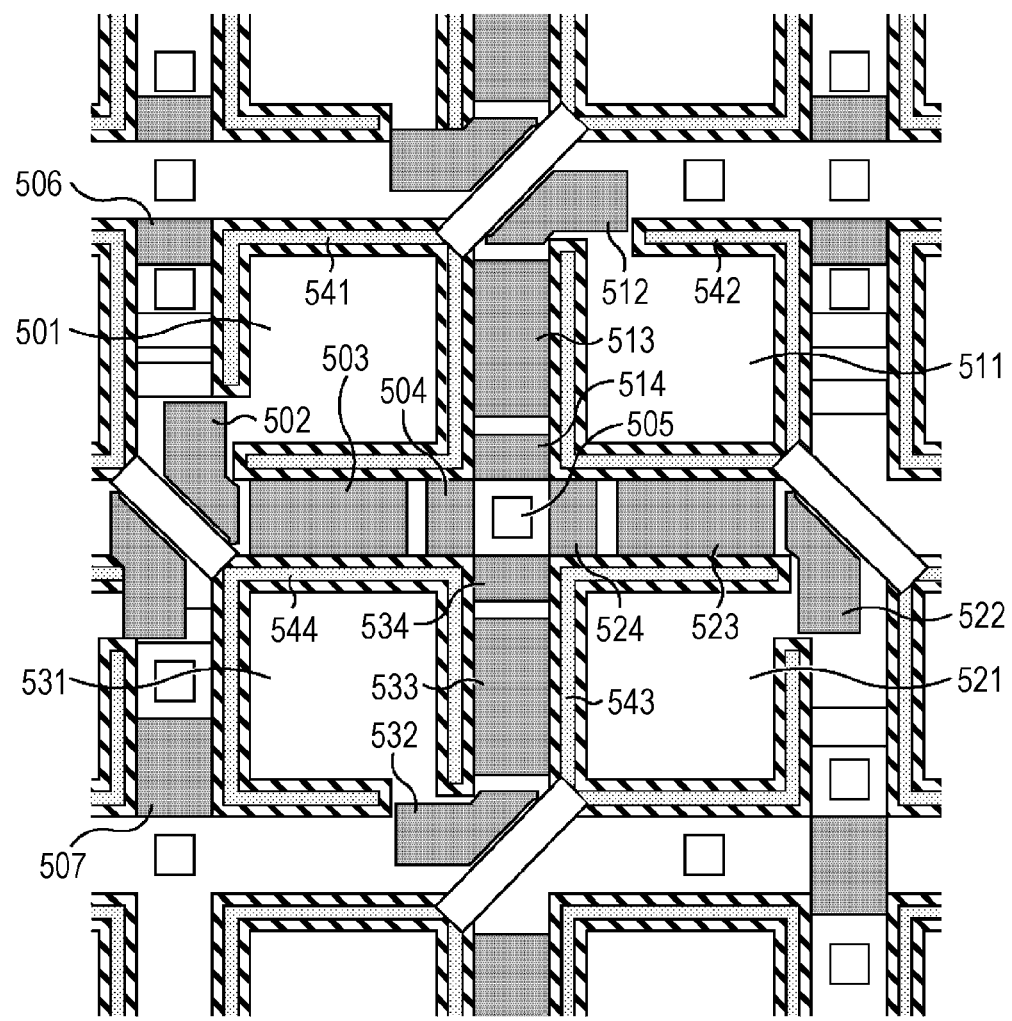
FIG. 17 is a diagram illustrating the configuration of a unit pixel.

FIG. 17 illustrates another configuration of the unit pixel. FIG. 17 is a diagram illustrating the configuration of the unit pixel, where the unit pixel according to a fifth embodiment is viewed from the upper surface (which is an opposite surface to a light-reception surface). A unit pixel 500 illustrated in FIG. 17 includes a photodiode 501, a transfer gate 502, a memory unit 503, a floating gate 504, a floating diffusion region 505, a reset gate 506, and an amplification transistor 507.

The configuration illustrated in FIG. 17 is a configuration in which an FD region (floating diffusion region) is shared by four pixels. In the configuration illustrated in FIG. 17, the floating diffusion region 505 is shared by four pixels of photodiodes 501, 511, 521, and 531. In each unit pixel illustrated in FIG. 17, the photodiode is surrounded by a light-shielding film, as in the unit pixel 400 illustrated in FIG. 15. However, a part of the light-shielding film is formed to be opened, as in the unit pixel 300 illustrated in FIG. 14.

For example, the photodiode 501 is surrounded by a light-shielding film 541, but a part of the light-shielding film 541 is opened, and the transfer gate 502 is formed in the opened portion. The other photodiodes of FIG. 17 have the same configuration. As described with reference to FIG. 14, since charge can be transferred from the photodiode 501 to the memory unit 503 without using a wiring, it is possible to reduce noise caused due to a dark current.

As described with reference to FIG. 15, since the periphery of the photodiode 501 is surrounded by the light-shielding film 541, it is possible to reduce the influence of stray light on the memory unit 503 or the like. In the configuration illustrated in FIG. 17, the floating diffusion region 505 is shared by four (2×2) adjacent pixels. Therefore, since the area of the memory unit 503 can be enlarged, it is possible to increase an amount of charge which can be retained.

Sixth Embodiment of Unit Pixel

Figure 18:
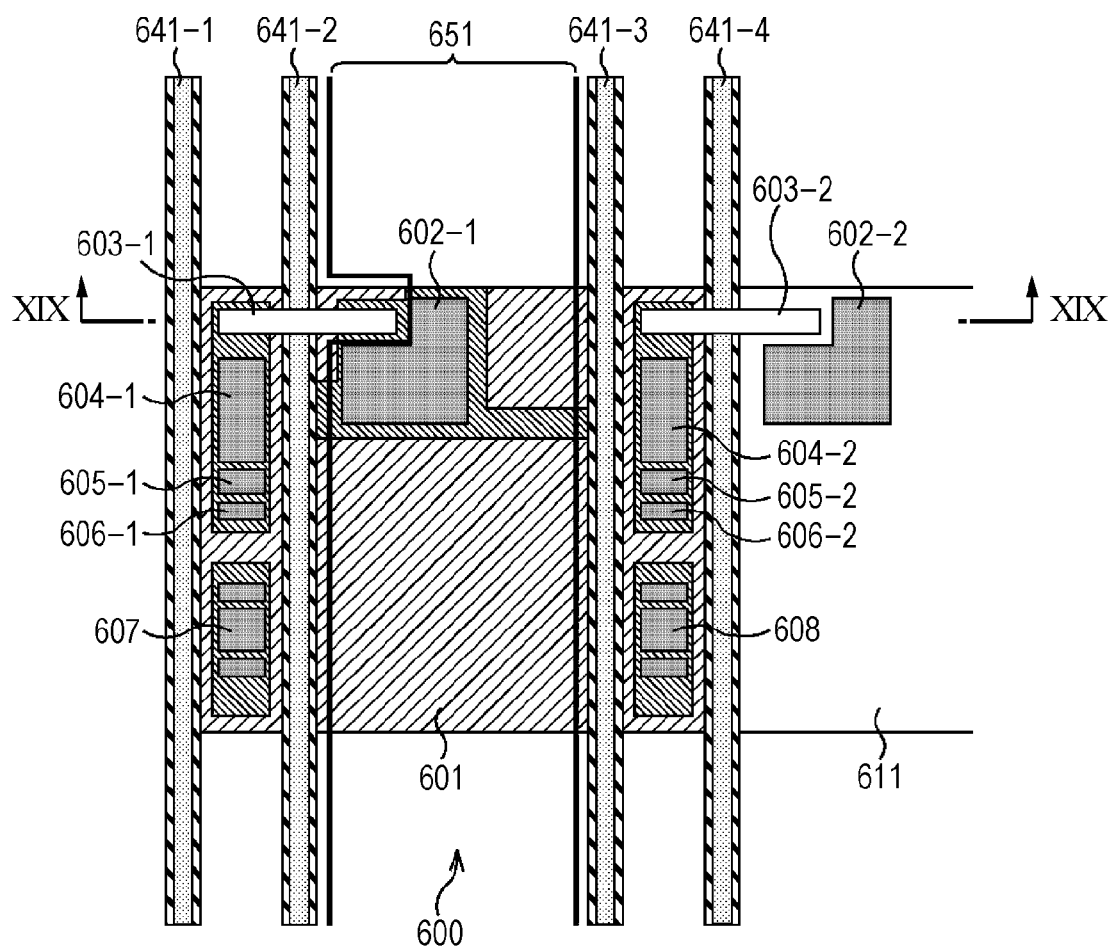
FIG. 18 is a diagram illustrating the configuration of a unit pixel.

FIG. 18 illustrates another configuration of the unit pixel. FIG. 18 is a diagram illustrating the configuration of the unit pixel, when the unit pixel according to a sixth embodiment is viewed from the upper surface (which is an opposite surface to a light-reception surface). The configuration of a unit pixel 600 illustrated in FIG. 18 is the same as the configuration of the unit pixel 150 illustrated in FIG. 5. That is, the unit pixel 600 includes a photodiode 601, a transfer gate 602-1, a wiring 603-1, a memory unit 604-1, a floating gate 605-1, a floating diffusion region 606-1, a reset gate 607, and an amplification transistor 608.

The arrangement of each unit of the unit pixel 600 illustrated in FIG. 18 is the same as that of the unit pixel 150 illustrated in FIG. 5. That is, the unit pixel 600 illustrated in FIG. 18 is the same as the unit pixel 150 illustrated in FIG. 5, when viewed from the upper surface, but is different as follows. In a portion of the photodiode 601 of the unit pixel 600, a trench portion 651 is present and the transfer gate 602-1 is disposed in the trench portion 651.

Figure 19:
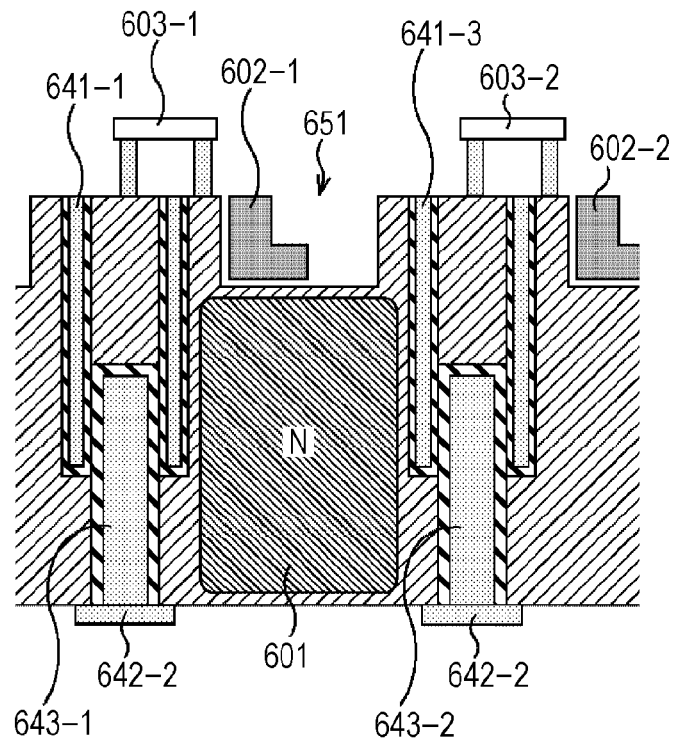
FIG. 19 is a cross-sectional view illustrating the unit pixel.

FIG. 19 is a diagram taken along the line XIX-XIX, when the unit pixel 600 illustrated in FIG. 18 is viewed from a side surface. Since light-shielding films 641, 642, and 643 of the unit pixel 600 illustrated in FIG. 19 are formed in the same manner as the light-shielding films 154, 155, and 156 of the unit pixel 150 illustrated in FIG. 4, the description thereof will be omitted.

As illustrated in FIG. 19, the transfer gate 602-1 is formed on the upper side of the photodiode 601 and is formed in the portion of the trench portion 651. The trench portion 651 is a portion trenched at a predetermined depth from the upper surface of the substrate. The transfer gate 602-1 is formed in the trenched portion.

When the light-shielding film 641 is formed, the trenching is performed on the substrate from the upper surface. However, the trench portion 651 may be formed at the time of the trenching. For example, in step S3 of the manufacturing process described with reference to FIG. 7, the trenching is performed on the substrate to form the light-shielding film 154. At this time, the trench portion 651 may be formed.

Alternatively, in step S8 of the manufacturing process described with reference to FIG. 8, the trenching may be performed on the substrate and the trench portion 651 may be formed, when the surplus insulation film is removed or after the surplus insulation film is removed.

Then, by forming the transfer gate 602-1, with a vertical shape in the trench portion 651 formed in this way, the unit pixel 600 as illustrated in FIG. 19 can be generated.

Thus, by forming the transfer gate 602 in a depth direction and forming the light-shielding films 641 to 643, it is possible to prevent light from leaking from the Si substrate to the memory unit 604. Further, the transfer gate 602 may be formed in a straight line shape in the depth direction (the upper and lower directions in FIG. 19) or may be formed in an L shape, as illustrated in FIG. 19.

Seventh Embodiment of Unit Pixel

Figure 20:
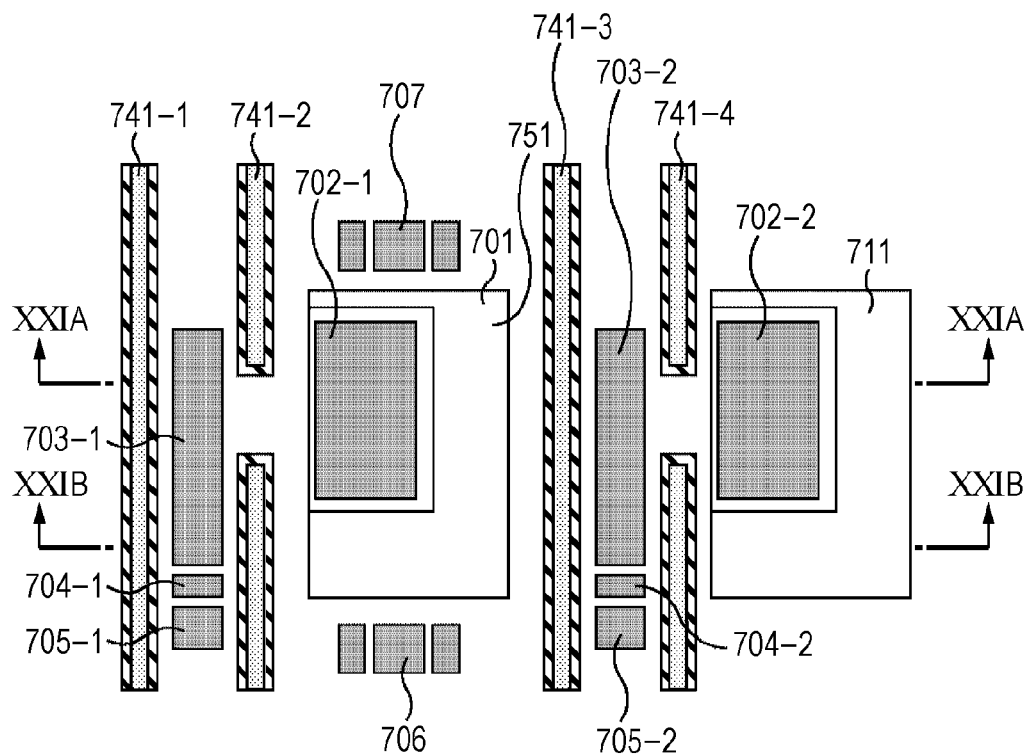
FIG. 20 is a diagram illustrating the configuration of a unit pixel.

FIG. 20 illustrates another configuration of the unit pixel. FIG. 20 is a diagram illustrating the configuration of the unit pixel, when the unit pixel according to a seventh embodiment is viewed from the upper surface (which is an opposite surface to a light-reception surface). A unit pixel 700 illustrated in FIG. 20 includes a photodiode 701, a transfer gate 702-1, a memory unit 703-1, a floating gate 704-1, a floating diffusion region 705-1, a reset gate 706, and an amplification transistor 707.

As in the unit pixel 600 illustrated in FIG. 18, the unit pixel 700 illustrated in FIG. 20 includes a trench portion 751 on the photodiode 701, and the transfer gate 702-1 is formed in the trench portion 751. The transfer gate 702-1 is formed in the opened portion of the light-shielding film 741-2. The configuration in which the transfer gate 702-1 is formed in the opened portion of the light-shielding film 741-2 is the same as the unit pixel 200 illustrated in FIG. 10. Accordingly, since the charge can be transferred from the photodiode 701 to the memory unit 703-1 without passing through a wiring, there are advantages such as a reduced occurrence of noise and a reduced influence of the noise.

As in the unit pixel 300 illustrated in FIG. 14, in the unit pixel 700 illustrated in FIG. 20, the reset gate 706 and the amplification transistor 707 are disposed outside of a light-shielding region. As described with reference to FIG. 14, even when the reset gate 706 and the amplification transistor 707 are disposed outside of the light-shielding region, the reset gate 706 or the amplification transistor 707 is turned on for a moment and the charge photoelectrically converted and accumulated by light immediately before the time of turn-on is discharged. Therefore, the influence on other portions is considered to be small.

Further, by forming the reset gate 706 or the amplification transistor 707 outside of the light-shielding region, the size of the memory unit 703 formed inside the light-shielding region can be enlarged, and thus it is possible to increase an amount of charge which can be accumulated.

Figure 21A:
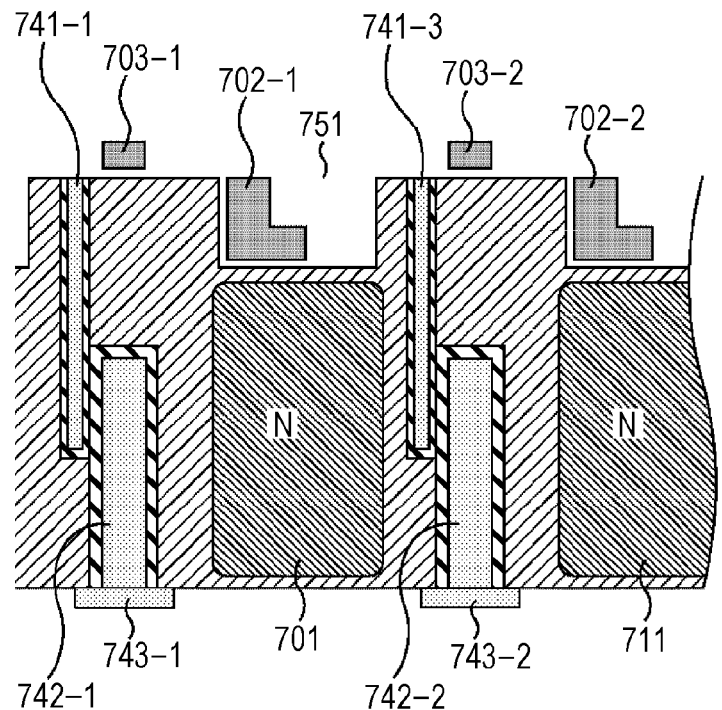
FIGS. 21A and 21B are cross-sectional views illustrating the unit pixel.
Figure 21B:
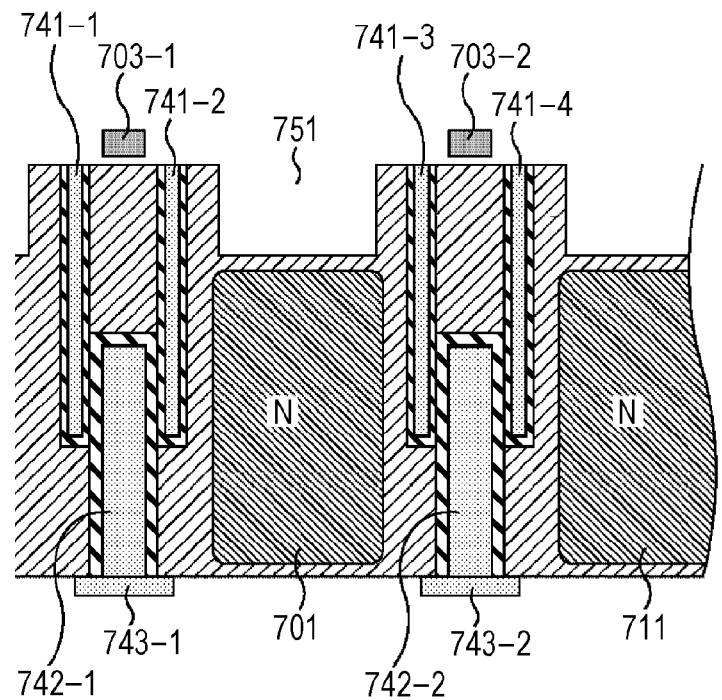

FIG. 21A is a diagram taken along the line XXIA-XXIA, when the unit pixel 700 illustrated in FIG. 20 is viewed from the side surface. FIG. 21B is a diagram taken along the line XXIB-XXIB, when the unit pixel 700 illustrated in FIG. 20 is viewed from the side surface. Since the light-shielding films 741 and 742 of the unit pixel 700 illustrated in FIG. 21 are formed in the same manner as the light-shielding films 241 and 261 of the unit pixel 200 illustrated in FIG. 12, the description thereof will be omitted. Light-shielding films 743 are formed on the rear surface side of the unit pixel 700 illustrated in FIGS. 21A and 21B.

The configuration in which the light-shielding films are formed is the same as the configuration described with reference to FIGS. 12A and 12B and the like, but is different in that a trench portion 751 is formed in the unit pixel 700 illustrated in FIG. 21. Referring to FIG. 21A, the trench portion 751 is formed at a predetermined depth on the upper side of the photodiode 701. The transfer gate 702-1 with an L shape is formed in the trench portion 751.

Since the transfer gate 702-1 is formed in the opened portion of the light-shielding film 741-2, as illustrated in FIG. 21A, the light-shielding film 741-2 is configured not to be formed in the portion in which the transfer gate 702-1 is present.

On the other hand, the light-shielding film 741-2 is configured to be formed in the portion in which the transfer gate 702-1 is not present, as illustrated in FIG. 21B.

Thus, a part of the light-shielding film 741 is opened. Thus, by forming the transfer gate 702 with the vertical shape in the opened portion and forming the light-shielding film 741 besides the portion in which the transfer gate 702 is formed, it is possible to prevent light from leaking from the Si substrate into the memory unit 703.

The transfer gate 702 may be formed of, for example, poly Si (polysilicon) or may be formed of a metal material. For example, more stray light entering into the memory unit 703 can be reduced when the transfer gate 702 is formed of a metal material than when the transfer gate 702 is configured to be formed of polysilicon.

The position of the transfer gate 702 may be in a corner portion of the photodiode 701 or may be in the middle portion of the photodiode 701. By disposing the transfer gate 702 in the middle portion of the photodiode 701, the distance between the photodiode 701 and the transfer gate 702 can be equally maintained. Therefore, it is possible to obtain the advantage of easily reading the charge. Further, even when the transfer gate 702 is disposed in the middle portion of the photodiode 701, the fact that the light can be prevented from entering into the memory unit 703 is not changed.

It is to be noted that the embodiments of the present technology are applicable to general electronic apparatuses that use the solid-state image pickup device in an image reading section (photoelectric conversion element). Examples of such electronic apparatuses may include: image pickup apparatuses such as digital still cameras and video camcorders; portable terminal apparatuses that have an image pickup function; and copy machines that use the solid-state image pickup device in the image reading section. The solid-state image pickup device may be formed as one chip, or may be in a module-like form having an image pickup function in which an image pickup section and a signal processing section are packaged together or in which an image pickup section and an optical system are packaged together.

Figure 22:
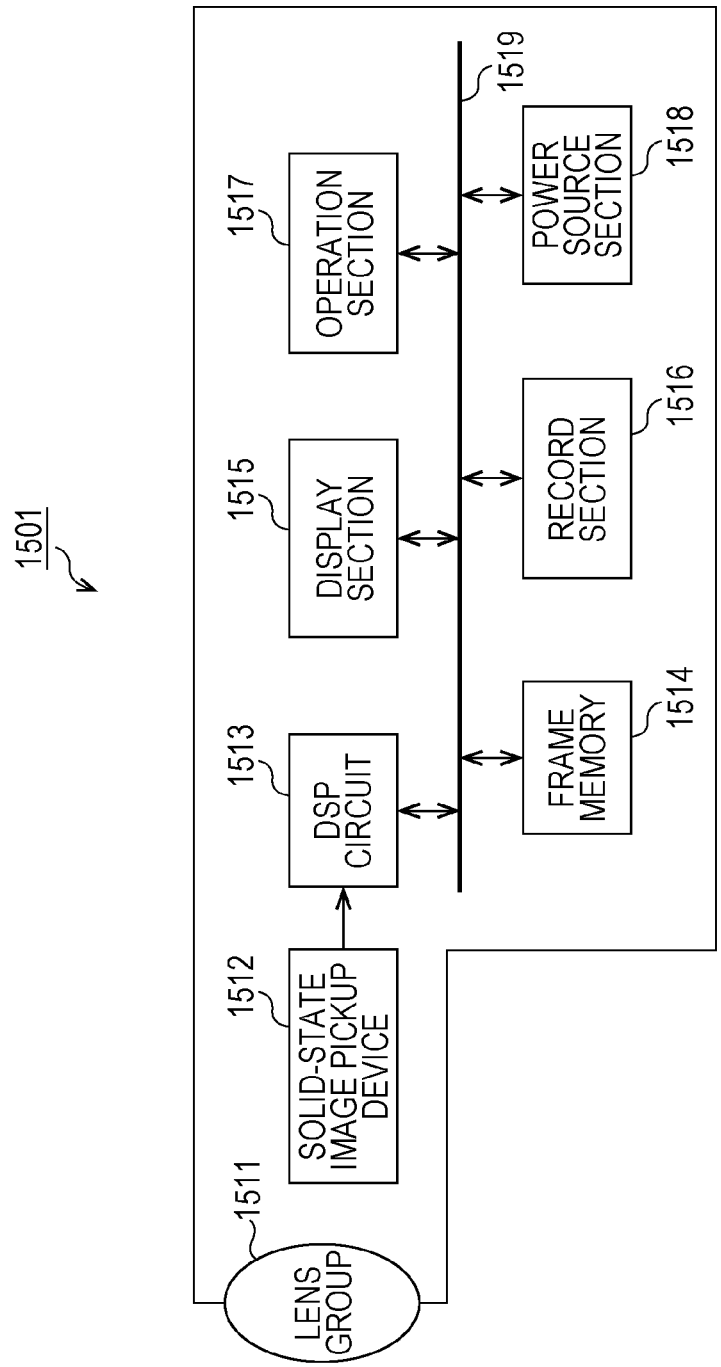
FIG. 22 is a block diagram illustrating a configuration example of an electronic apparatus to which the present technology is applied.

FIG. 22 is a diagram illustrating a configuration example of an image pickup apparatus as an electronic apparatus to which the above-described embodiments of the present technology is applied.

An image pickup apparatus 1501 shown in FIG. 22 includes an optical section 1511 including lens groups etc., a solid-state image pickup device (image pickup device) 1512, and a DSP (Digital Signal Processor) circuit 1513 that is a camera signal processing circuit. Further, the image pickup apparatus 1501 also includes a frame memory 1514, a display section 1515, a record section 1516, an operation section 1517, and a power source section 1518. The DSP circuit 1513, the frame memory 1514, the display section 1515, the record section 1516, the operation section 1517, and the power source section 1518 are connected to one another via a bus line 1519.

The optical section 1511 takes in incident light (image light) from a subject and forms an image on an image pickup plane of the solid-state image pickup device 1512. The solid-state image pickup device 1512 converts, into an electric signal, an amount of incident light that is used to form the image on the image pickup plane in a pixel unit, and outputs the electric signal as a pixel signal. The solid-state image pickup device 1512 corresponds to the above-described solid-state image pickup device 11. The display section 1515 may be formed, for example, of a panel-type display such as a liquid crystal panel and an organic EL (Electro Luminescence) panel. The display section 1515 displays moving image or a still image that has been picked up by the solid-state image pickup device 1512. The record section 1516 records the moving image or the still image that has been picked up by the solid-state image pickup device 1512 in a recording media such as a video tape and a DVD (Digital Versatile Disk).

The operation section 1517 gives, based on operation by a user, operation instructions related to various functions of the image pickup apparatus 1501. The power source section 1518 appropriately supplies various power sources that serve as operation power sources of the DSP circuit 1513, the frame memory 1514, the display section 1515, the record section 1516, and the operation section 1517 to these targets.

The above embodiments are described referring to the case as an example in which the embodiments are applied to a CMOS image sensor in which pixels that detects signal electric charge according to an amount of visible light as physical amount are arranged in rows and columns. However, the present technology is not limitedly applied to CMOS image sensors but is applicable to general solid-image pickup devices.

The above-described embodiments of the present technology is not limitedly applied to the image pickup device that detects distribution of an amount of incident visible light and picks up the distribution as an image. The above-described embodiments of the present technology is applicable to a solid-state image pickup device that picks up distribution of incident amount of infrared ray, X-ray, particles, etc. as an image.

According to the embodiments of the present technology, it is possible to suppress optical noise of the charge retention region (memory unit), while the sensitivity of the photodiode is ensured. The embodiments of the present technology can be applied to a global shutter type sensor. Further, since a charge retention region of a sensor can have a large volume, it is possible to increase the saturation capacity of the charge retention region.

Embodiments of the present technology are not limited to the above-described embodiments, but may be modified in various ways within the scope of the present technology without departing from the gist of the present technology.

The present technology may be configured as follows.

(1)

An imaging element includes: a photoelectric conversion unit; a charge retention unit that retains charge accumulated in the photoelectric conversion unit; and light-shielding units that are formed on at least two sides of four sides of the photoelectric conversion unit in a direction in which the photoelectric conversion units are adjacent to each other. The charge retention unit is formed in a region shielded from light by two light-shielding units.

(2)

In the imaging element described in (1), the light-shielding unit may be formed in a substrate in which the photoelectric conversion unit and the charge retention unit are formed. When the direction in which the photoelectric conversion units are adjacent to each other is assumed to be a horizontal direction, the light-shielding unit may be formed in the substrate to penetrate therethrough in a vertical direction.

(3)

In the imaging element described in (1) or (2), the light-shielding unit formed on one side of the photoelectric conversion unit may be formed in the substrate in which the photoelectric conversion unit and the charge retention unit are formed. When the direction in which the photoelectric conversion units are adjacent to each other is assumed to be a horizontal direction, the light-shielding unit may be formed in a vertical direction. When a surface of the photoelectric conversion unit on which light is incident is assumed to be a rear surface and a surface facing the rear surface is assumed to be a front surface, the light-shielding unit may include a first light-shielding unit formed up to a halfway portion of the substrate from the front surface in the vertical direction and a second light-shielding unit formed up to a halfway portion of the substrate from the rear surface.

(4)

In the imaging element described in (3), the second light-shielding unit may be formed between two first light-shielding units. The first light-shielding units and the second light-shielding unit may be formed such that an overlapping portion is present in the vertical direction.

(5)

The imaging element described in any one of (2) to (4) may further include a transfer unit that transfers the charge from the photoelectric conversion unit to the charge retention unit. A portion in which the transfer unit is located may be opened toward the photoelectric conversion unit.

(6)

The imaging element described in any one of (3) to (5) may further include a transfer unit that transfers the charge from the photoelectric conversion unit to the charge retention unit. The first light-shielding unit may include an opening in a portion in which the transfer unit is located.

(7)

The imaging element described in any one of (1) to (6) may further include a charge voltage unit that converts the charge accumulated in the charge retention unit into a voltage; a transfer unit that transfers the charge accumulated in the charge retention unit to the charge voltage unit; a reset unit that resets the charge voltage unit; and a reading unit that reads the voltage of the charge voltage unit. At least one of the reset unit and the reading unit may be disposed out of the region shielded from the light by the light-shielding units.

(8)

In the imaging element described in any one of (1) to (7), the light-shielding units may be formed on four sides of the photoelectric conversion unit in the direction in which the photoelectric conversion units are adjacent to each other.

(9)

The imaging element described in any one of (1) to (8) may further include a charge voltage unit that converts the charge accumulated in the charge accumulation unit into a voltage. The charge voltage unit may be shared by four adjacent photoelectric conversion units.

(10)

The imaging element described in any one of (1) to (9) may further include a transfer unit that transfers the charge from the photoelectric conversion unit to the charge retention unit. When the direction in which the photoelectric conversion units are adjacent to each other is assumed to be a horizontal direction, the light-shielding unit may be formed in a vertical direction of a substrate in which the photoelectric conversion unit and the charge retention unit are formed. The transfer unit may be formed at a position different from the region shielded from the light by the two light-shielding units in which the charge retention unit is formed and in a portion trenched at a predetermined depth in the vertical direction of the substrate.

(11)

In the imaging element described in (10), the light-shielding unit in the portion in which the transfer unit is located may be opened.

(12)

There is provided a method of manufacturing an imaging element including a photoelectric conversion unit, a charge retention unit that retains charge accumulated in the photoelectric conversion unit, and light-shielding units that are formed on at least two sides of four sides of the photoelectric conversion unit in a direction in which the photoelectric conversion units are adjacent to each other. The method includes: forming the light-shielding unit formed on one side of the photoelectric conversion unit in a substrate in which the photoelectric conversion unit and the charge retention unit are formed; forming the light-shielding unit in a vertical direction, when a direction in which the photoelectric conversion units are adjacent to each other is assumed to be a horizontal direction; and forming, when a surface of the photoelectric conversion unit on which light is incident is assumed to be a rear surface and a surface facing the rear surface is assumed to be a front surface, a first light-shielding unit formed up to a halfway portion of the substrate from the front surface in the vertical direction and forming a second light-shielding unit formed up to a halfway portion of the substrate from the rear surface.

[1]

A solid-state image sensor comprising:
a substrate having a photoelectric conversion element disposed therein, the photoelectric conversion element converting an amount of incident light into a charge amount;
a memory unit disposed at a side of the photoelectric conversion element, the memory unit receiving the charge amount from the photoelectric conversion element;
a first light-shielding section formed at a first side of the memory unit and disposed between the memory unit and the photoelectric conversion element; and
a second light-shielding section formed at a second side of the memory unit such that the second side is opposite the first side.

The solid-state image sensor according to [1], further comprising:
a transfer gate at least partially disposed in the photoelectric conversion region, the transfer gate transferring the charge photoelectrically converted by the photodiode to the memory unit, wherein a wiring layer connects the transfer gate to the memory unit through the first light-shielding film.

[3]

The solid-state image sensor according to [1] or [2], further comprising:
a transfer gate at least partially disposed in an opening of the first light-shielding film, the transfer gate transferring the charge photoelectrically converted by the photodiode to the memory unit.

[4]

The solid-state image sensor according to [3], wherein the charge is transferred from the transfer gate to the memory unit on the substrate.

[5]

The solid-state image sensor according to any one of [1] to [4], further comprising:
a floating gate, a floating diffusion region, and a reset gate, wherein each of the floating gate, the floating diffusion region, and the reset gate are disposed between the first light shielding section and the second light shielding section.

[6]

The solid-state image sensor according to any one of [1] to [5], further comprising:
a third light light-shielding section formed at a back surface of the substrate, wherein the third light-shielding section is formed to be substantially equal to a gap between the first light-shielding section and the second light-shielding section.

[7]

The solid-state image sensor according to any one of [1] to [6], wherein at least a portion of the first light-shielding section and a portion of the second light-shielding section are formed such that they extend downward from an upper substrate surface and penetrate substantially halfway through the substrate in a depth direction.

[8]
The solid-state image sensor according to [7], further comprising:
a third light-shielding section alternately arranged between the first light shielding section and the second light shielding section.

[9]
The solid-state image sensor according to any one of [1] to [8], wherein light received by the photoelectric conversion section is incident at back surface of the substrate.
An electronic apparatus including:
an optical unit; and
a solid-state imaging device comprising unit pixels arranged in a 2-dimential matrix, wherein each unit pixel comprises:
  (a) a substrate having a photoelectric conversion element disposed therein, the photoelectric conversion element converting an amount of incident light into a charge;
  (b) a memory unit disposed at a side of the photoelectric conversion element, the memory unit receiving the charge from the photoelectric conversion element;
  (c) a first light-shielding section formed at a first side of the memory unit and disposed between the memory unit and the photoelectric conversion element; and
  (d) a second light-shielding section formed at a second side of the memory unit such that the second side is opposite the first side.

[11]
The electronic apparatus according to [10], further comprising:
a transfer gate at least partially disposed in the photoelectric conversion region, the transfer gate transferring the charge photoelectrically converted by the photodiode to the memory unit, wherein a wiring layer connects the transfer gate to the memory unit through the first light-shielding film.

[12]
The electronic apparatus according to [10] or [11], further comprising:
a transfer gate at least partially disposed in an opening of the first light-shielding film, the transfer gate transferring the charge photoelectrically converted by the photodiode to the memory unit.

[13]
The electronic apparatus according to [12], wherein the charge is transferred from the transfer gate to the memory unit on the substrate.
The electronic apparatus according to any one of [10] to [13], further comprising:
a floating gate, a floating diffusion region, and a reset gate, wherein each of the floating gate, the floating diffusion region, and the reset gate are disposed between the first light shielding section and the second light shielding section.

[15]
The electronic apparatus according to any one of [10] to [14], further comprising:
a third light light-shielding section formed at a back surface of the unit pixel, wherein the third light-shielding section is formed to be substantially equal to a gap between the first light-shielding section and the second light-shielding section.

[16]
The electronic apparatus according to any one of [10] to [15], wherein at least a portion of the first light-shielding section and the second light-shielding section are formed such that they extend downward from an upper substrate surface and penetrate substantially halfway through the substrate in a depth direction.

[17]
The electronic apparatus according to [16], further comprising:
a third light-shielding section alternately arranged between the first light shielding section and the second light shielding section.

[18]
The electronic apparatus according to any one of [10] to [17], wherein light received by the photoelectric conversion section is incident at back surface of the substrate and the solid-state image device is of the global shutter type.

[19]
A method of manufacturing a solid-state image sensor, comprising the steps of:
implanting a plurality of isolation regions into a substrate;
implanting impurities into the plurality of isolation regions to form one or more photodiodes, one or more memory units, and one or more transfer gates;
forming one or more trenches in portions of the substrate in which light-shielding sections are to be formed;
embedding a light-shielding material into the one or more trenches; and
wherein a first light-shielding section is formed at a first side of the memory unit and disposed between a charge accumulation region and the photodiode and wherein a second light-shielding section is formed at a second side of the memory unit such that the second side is opposite the first side.

[20]
The method of manufacturing a solid-state image sensor according to [19], wherein the transfer gate is at least partially disposed in the photodiode, the transfer gate transferring the charge photoelectrically converted by the photodiode to the memory unit, and wherein a wiring layer is formed to connect the transfer gate to the memory unit through the first light-shielding film.

[21]
The method of manufacturing a solid-state image sensor according to [19] or [20], wherein a transfer gate is at least partially disposed in an opening of the first light-shielding film, the transfer gate transferring the charge photoelectrically converted by the photodiode to the memory unit.

[22]
The method of manufacturing a solid-state image sensor according to any one of [19] to [21], wherein the charge is transferred from the transfer gate to the memory unit on the substrate.

The present disclosure contains subject matter related to that disclosed in Japanese Priority Patent Application JP 2012-247581 filed in the Japan Patent Office on Nov. 9, 2012, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:
1. A solid-state image sensor comprising:
  a substrate having a photoelectric conversion element disposed therein, the photoelectric conversion element converting an amount of incident light into a charge amount;
  a memory unit disposed at a side of the photoelectric conversion element, the memory unit receiving the charge amount from the photoelectric conversion element;

a first light-shielding section formed at a first side of the memory unit and disposed between the memory unit and the photoelectric conversion element;

a second light-shielding section formed at a second side of the memory unit such that the second side is opposite the first side; and a third light light-shielding section formed at a back surface of the substrate, wherein a size of the third light-shielding, section is formed to be substantially equal to a gap between the first light-shielding section and the second light-shielding section.

2. The solid-state image sensor according to claim 1, further comprising:

a transfer gate at least partially disposed in a region of the photoelectric conversion element, the transfer gate transferring the charge amount photoelectrically converted by the photoelectric conversion element to the memory unit, wherein a wiring layer connects the transfer gate to the memory unit through the first light-shielding film.

3. The solid-state image sensor according to claim 1, further comprising:

a transfer gate at least partially disposed in an opening of the first light-shielding film, the transfer gate transferring the charge amount photoelectrically converted by the photoelectric conversion element to the memory unit.

4. The solid-state image sensor according to claim 3, wherein the charge is transferred from the transfer gate to the memory unit on the substrate.

5. The solid-state image sensor according to claim 1, further comprising:

a floating gate, a floating diffusion region, and a reset gate, wherein each of the floating gate, the floating diffusion region, and the reset gate are disposed between the first light shielding section and the second light shielding section.

6. The solid-state image sensor according to claim 1, wherein at least a portion of the first light-shielding section and a portion of the second light-shielding section are formed such that they extend downward from an upper substrate surface and penetrate substantially halfway through the substrate in a depth direction.

7. The solid-state image sensor according to claim 1, wherein light received by the photoelectric conversion section is incident at a back surface of the substrate.

8. An electronic apparatus including:

an optical unit; and a solid-state imaging device comprising unit pixels arranged in a 2-dimensional matrix, wherein each unit pixel comprises:

a substrate having a photoelectric conversion element disposed therein, the photoelectric conversion element converting an amount of incident light into a charge;

a memory unit disposed at a side of the photoelectric conversion element, the memory unit receiving the charge from the photoelectric conversion element;

a first light-shielding section formed at a first side of the memory unit and disposed between the memory unit and the photoelectric conversion element;

a second light-shielding section formed at a second side of the memory unit such that the second side is opposite the first side;

a floating gate;

a floating diffusion region; and a reset gate, wherein each of the floating gate, the floating diffusion region, and the reset rate are disposed between the first light shielding section and the second light shielding section.

9. The electronic apparatus according to claim 8, further comprising:

a transfer gate at least partially disposed in a region of the photoelectric conversion element, the transfer gate transferring the charge photoelectrically converted by the photoelectric conversion element to the memory unit, wherein a wiring layer connects the transfer gate to the memory unit through the first light-shielding film.

10. The electronic apparatus according to claim 8, further comprising:

a transfer gate at least partially disposed in an opening of the first light-shielding film, the transfer gate transferring the charge photoelectrically converted by the photoelectric conversion element to the memory unit.

11. The electronic apparatus according to claim 10, wherein the charge is transferred from the transfer gate to the memory unit on the substrate.

12. The electronic apparatus according to claim 8, wherein light received by the photoelectric conversion section is incident at back surface of the substrate and the solid-state image device is of the global shutter type.

13. An electronic apparatus including:

an optical unit; and a solid-state imaging device comprising unit pixels arranged in a 2-dimensional matrix, wherein each unit pixel comprises:

a substrate having a photoelectric conversion element disposed therein, the photoelectric conversion element converting an amount of incident light into a charge;

a memory unit disposed at a side of the photoelectric conversion element, the memory unit receiving the charge from the photoelectric conversion element;

a first light-shielding section formed at a first side of the memory unit and disposed between the memory unit and the photoelectric conversion element;

a second light-shielding section formed at a second side of the memory unit such that the second side is opposite the first side; and a third light light-shielding section formed at a back surface of the unit pixel, wherein the third light-shielding section is formed to be substantially equal to a gap between the first light-shielding section and the second light-shielding section.

14. An electronic apparatus including:

an optical unit; and a solid-state imaging device comprising unit pixels arranged in a 2-dimensional matrix, wherein each unit pixel comprises:

a substrate having a photoelectric conversion element disposed therein, the photoelectric conversion element converting an amount of incident light into a charge;

a memory unit disposed at a side of the photoelectric conversion element, the memory unit receiving the charge from the photoelectric conversion element;

a first light-shielding section formed at a first side of the memo unit and disposed between the memory unit and the photoelectric conversion element; and a second light-shielding section formed at a second side of the memory unit such that the second side is opposite the first side, wherein at least a portion of the first light-shielding section and the second light-shielding section are formed such that they extend downward from an upper substrate surface and penetrate substantially halfway through the substrate in a depth direction.

15. The electronic apparatus according to claim 14, further comprising:
a third light-shielding section alternately arranged between the first light shielding section and the second light shielding section.

* * * * *